United States Patent
Puzella et al.

(10) Patent No.: US 7,671,696 B1
(45) Date of Patent: Mar. 2, 2010

(54) RADIO FREQUENCY INTERCONNECT CIRCUITS AND TECHNIQUES

(75) Inventors: Angelo M. Puzella, Marlborough, MA (US); Joseph M. Crowder, Marlboro, MA (US); Patricia S. Dupuis, Medway, MA (US); Michael C. Fallica, Reading, MA (US); John B. Francis, Littleton, MA (US); Joseph A. Licciardello, Nashua, NH (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 11/558,126

(22) Filed: Nov. 9, 2006

Related U.S. Application Data

(62) Division of application No. 11/533,848, filed on Sep. 21, 2006.

(51) Int. Cl.
*H03H 7/38* (2006.01)
(52) U.S. Cl. .................................. 333/33; 333/260
(58) Field of Classification Search ............... 333/32, 333/33, 246, 238, 260
See application file for complete search history.

(56) References Cited

U.S. PATENT DOCUMENTS

| | | | |
|---|---|---|---|
| 3,091,743 A | 5/1963 | Wilkinson | |
| 5,493,305 A | 2/1996 | Wooldridge et al. | |
| 5,907,304 A | 5/1999 | Wilson et al. | |
| 6,037,903 A | 3/2000 | Lange et al. | |
| 6,078,289 A | 6/2000 | Manoogian et al. | |
| 6,166,705 A | 12/2000 | Mast et al. | |
| 6,297,775 B1 | 10/2001 | Haws et al. | |
| 6,388,620 B1 | 5/2002 | Bhattacharyya | |
| 6,424,313 B1 | 7/2002 | Navarro et al. | |
| 6,480,167 B2 | 11/2002 | Matthews | |
| 6,611,180 B1 | 8/2003 | Puzella et al. | |
| 6,621,470 B1 | 9/2003 | Boeringer et al. | |
| 6,624,787 B2 | 9/2003 | Puzella et al. | |
| 6,661,376 B2 | 12/2003 | Maceo et al. | |
| 6,670,930 B2 | 12/2003 | Navarro | |
| 6,686,885 B1 | 2/2004 | Barkdoll et al. | |
| 6,703,976 B2 | 3/2004 | Jacomb-Hood et al. | |
| 6,731,189 B2 | 5/2004 | Puzella et al. | |
| 6,856,210 B2 * | 2/2005 | Zhu et al. | 333/33 |
| 6,900,765 B2 | 5/2005 | Navarro et al. | |
| 6,995,322 B2 * | 2/2006 | Chan et al. | 174/262 |

(Continued)

OTHER PUBLICATIONS

Carter; "'Fuzz Button' Interconnects at Microwave and MM-Wave Frequencies;" IEEE Seminar; London, UK; Mar. 1-6, 2000; 7 sheets.

(Continued)

*Primary Examiner*—Stephen E Jones
(74) *Attorney, Agent, or Firm*—Daly, Crowley, Mofford & Durkee, LLP

(57) ABSTRACT

A multilayer circuit board assembly includes one or more radio frequency (RF) interconnects between different circuit layers on different circuit boards which make up the circuit board assembly. The RF interconnects can include one or more RF matching pads which provide a mechanism for matching impedance characteristics of RF stubs to provide the RF interconnects having desired insertion loss and impedance characteristics over a desired RF operating frequency band. The RF matching pads allow the manufacture of circuit boards having RF interconnects without the need to perform any back drill and back fill operation to remove stub portions of the RF interconnects in the multilayer circuit board assembly.

19 Claims, 13 Drawing Sheets

U.S. PATENT DOCUMENTS

| | | | |
|---|---|---|---|
| 7,030,712 B2 * | 4/2006 | Brunette et al. | 333/33 |
| 2003/0067410 A1 | 4/2003 | Puzella et al. | |
| 2005/0110681 A1 | 5/2005 | Londre | |
| 2005/0151215 A1 | 7/2005 | Hauhe et al. | |

OTHER PUBLICATIONS

Jerinic et al.; "X-Band "Tile" Array for Mobile RADAR" internal Raytheon publication; Spring 2003.

Puzella; "Deliverable Demonstration Sub-Array;" internal Raytheon publication; Fall 2003.

Puzella at al.; "X-Band Tile Sub-Array;" internal Raytheon publication; Spring 2003.

Puzella et al.; "Digital Subarray for Large Apertures;" internal Raytheon publication, Spring 2003.

Puzella et al.; "Tile Sub-Array and Related Circuits and Techniques;" U.S. Appl. No. 11/533,848, filed Sep. 21, 2006.

PCT/US2007/074795 International Search Report dated Dec. 19, 2007.

PCT/US2007/074795 Written Opinion of the International Search Report dated Dec. 19, 2007.

PCT International Preliminary Report on Patentability dated Apr. 2, 2009; for PCT/US2007/074795 filed Jul. 31, 2007; 7 pages.

* cited by examiner

RADIO FREQUENCY INTERCONNECT CIRCUITS AND TECHNIQUES

CROSS-REFERENCE TO RELATED APPLICATIONS

This application is a Divisional of co-pending application Ser. No. 11/533,848 filed on Sep. 21, 2006.

FIELD OF THE INVENTION

This invention relates generally to phased array antennas adapted for volume production at a relatively low cost and having a relatively low profile and more particularly to radio frequency (RF) circuits and techniques utilized in phased array antennas.

BACKGROUND OF THE INVENTION

As is known in the art, a phased array antenna includes a plurality of antenna elements spaced apart from each other by known distances coupled through a plurality of phase shifter circuits to either or both of a transmitter or receiver. In some cases, the phase shifter circuits are considered to be part of the transmitter and/or receiver.

As is also known, phased array antenna systems are adapted to produce a beam of radio frequency energy (RF) and direct such beam along a selected direction by controlling the phase (via the phase shifter circuitry) of the RF energy passing between the transmitter or receiver and the array of antenna elements. In an electronically scanned phased array, the phase of the phase shifter circuits (and thus the beam direction) is selected by sending a control signal or word to each of the phase shifter sections. The control word is typically a digital signal representative of a desired phase shift, as well as a desired attenuation level and other control data.

Including phase shifter circuits and amplitude control circuits in a phased array antenna typically results in the antenna being relatively large, heavy and expensive. Size, weight and cost issues in phased array antennas are further exacerbated when the antenna is provided as a so-called "active aperture" (or more simply "active") phased array antenna since an active aperture antenna includes both transmit and receive circuits.

Phased array antennas are often used in both defense and commercial electronic systems. For example, Active, Electronically Scanned Arrays (AESAs) are in demand for a wide range of defense and commercial electronic systems such as radar surveillance, terrestrial and satellite communications, mobile telephony, navigation, identification, and electronic counter measures. Such systems are often used in radar for National Missile Defense, Theater Missile Defense, Ship Self-Defense and Area Defense, ship and airborne radar systems and satellite communications systems. Thus, the systems are often deployed on a single structure such as a ship, aircraft, missile system, missile platform, satellite or building where a limited amount of space is available.

AESAs offer numerous performance benefits over passive scanned arrays as well as mechanically steered apertures. However, the costs that can be associated with deploying AESAs can limit their use to specialized military systems. An order of magnitude reduction in array cost could enable widespread AESA insertion into military and commercial systems for radar, communication, and electronic warfare (EW) applications. The performance and reliability benefits of AESA architectures could extend to a variety of platforms, including ships, aircraft, satellites, missiles, and submarines.

Many conventional phased array antennas use a so-called "brick" type architecture. In a brick architecture, radio frequency (RF) signals and power signals fed to active components in the phased array are generally distributed in a plane that is perpendicular to a plane coincident with (or defined by) the antenna aperture. The orthogonal arrangement of antenna aperture and RF signals of brick-type architecture can sometimes limit the antenna to a single polarization configuration. In addition, brick-type architectures can result in antennas that are quite large and heavy, thus making difficult transportability and deployment of such antennas.

Another architecture for phased array antennas is the so-called "tile" architecture. With a tile architecture, the RF circuitry and signals are distributed in a plane that is parallel to a plane defined by the antenna aperture. The tile architecture uses basic building blocks in the form of "tiles" wherein each tile can be formed of a multi-layer printed circuit board structure including antenna elements and its associated RF circuitry encompassed in an assembly, and wherein each antenna tile can operate by itself as a substantially planar phased array or as a sub-array of a much larger array antenna.

For an exemplary phased array having a tile architecture, each tile can be a highly integrated assembly that incorporates a radiator, a transmit/receive (T/R) channel, RF and power manifolds and control circuitry, all of which can be combined into a low cost light-weight assembly for implementing AESA. Such an architecture can be particularly advantageous for applications where reduced weight and size of the antenna are important to perform the intended mission (e.g., airborne or space applications) or to transport and deploy a tactical antenna at a desired location.

It would, therefore, be desirable to provide an AESA having an order of magnitude reduction in the size, weight, and cost of a front end active array as compared to existing technology, while simultaneously demonstrating high performance.

SUMMARY OF THE INVENTION

As mentioned above, the relatively high cost of phased arrays has precluded the use of phased arrays in all but the most specialized applications. Assembly and component costs, particularly for active transmit/receive channels, are major cost drivers. Phased array costs can be reduced by utilizing batch processing and minimizing touch labor of components and assemblies. It would be advantageous to provide a tile sub-array for an Active, Electronically Scanned Array (AESA) that is compact, which can be manufactured in a cost-effective manner, that can be assembled using an automated process, and that can be individually tested prior to assembly into the AESA. There is also a need to lower acquisition and life cycle costs of phased arrays, while at the same time improving bandwidth, polarization diversity and robust RF performance characteristics to meet increasingly more challenging antenna performance requirements.

At least some embodiments of a tile sub-array architecture described herein enable a cost effective phased array solution for a wide variety of phased array radar missions or communication missions for ground, sea and airborne platforms. In addition, in at least one embodiment, the tile sub-array provides a thin, lightweight construction that can also be applied to conformal arrays on an aircraft wing or fuselage or on a Unmanned Aerial Vehicle (UAV).

In one so-called "packageless T/R channel" embodiment, a tile sub-array simultaneously addresses cost and performance for next generation radar and communication systems. Many phased array designs are optimized for a single mission or platform. In contrast, the flexibility of the tile sub-array architecture described herein enables a solution for a larger set of missions. For example, in one embodiment, a so-called upper multi-layer assembly (UMLA) and a lower multi-layer assembly (LMLA), each described further herein, serve as common building blocks. The UMLA is a layered RF transmission line assembly which performs RF signal distribution, impedance matching and generation of polarization diverse signals. Fabrication is based on multi-layer printed wiring board (PWB) materials and processes. The LMLA integrates a package-less Transmit/Receive (T/R) channel and an embedded circulator layer sub-assembly. In a preferred embodiment, the LMLA is bonded to the UMLA using a ball grid array (BGA) interconnect approach. The package-less T/R channel eliminates expensive T/R module package components and associated assembly costs. The key building block of the package-less LMLA is a lower multi-layer board (LMLB). The LMLB integrates RF, DC and Logic signal distribution and an embedded circulator layer. All T/R channel monolithic microwave integrated circuits (MMIC's) and components, RF, DC/Logic connectors and thermal spreader interface plate can be assembled onto the LMLA using pick and place equipment.

In accordance with a further aspect of the present invention, a tile sub-array comprises at least one printed circuit board assembly comprising one or more RF interconnects between different circuit layers on different circuit board with each of the RF interconnects comprising one or more RF matching pads which provide a mechanism for matching impedance characteristics of RF stubs to provide the RF interconnects having desired insertion loss and impedance characteristics over a desired RF operating frequency band.

With this particular arrangement, a tile sub-array can be manufactured without the need to perform any back-drill and back-fill operations typically required to eliminate RF via stubs. The RF matching pad technique refers to a technique in which a conductor is provided on blank layers (i.e., layers with no copper) of a circuit board or in ground plane layers (with etched relief area) of a circuit board. The conductor and associated relief area provided the mechanism to adjust impedance characteristics of RF vias (also referred to as RF interconnect circuits) provided in a circuit board. Since the need to utilize back-drill and back-fill operations is eliminated, the RF matching pad approach enables a standard, low aspect ratio drill and plate manufacturing operation to produce an RF via that connects inner circuit layers and which also has a low insertion loss characteristic across a desired frequency band such as X-Band (8 GHz-12 GHz).

As is known, mode suppression vias help electrically isolate the RF interconnects from surrounding circuitry, thereby preventing signals from "leaking" between signal paths. In conventional systems, the mode suppression vias are also drilled and plated at the same time the interconnecting RF via is drilled and plated.

With the RF matching pad approach of the present invention, however, all RF and mode suppression vias can be drilled and plated through the entire assembly and there is no need to utilize and back drill and fill operations on the RF interconnects. Thus, manufacturing costs associated with back drill and back fill operations can be completely eliminated while simultaneously improving RF performance because channel to channel variations due to drill tolerances and backfill material tolerances are eliminated.

In one embodiment, the RF matching pad technique utilizes copper disks surrounded by an annular ring relief area in ground plane layers of RF interconnects and mode suppression circuits. The RF matching pad technique is a general technique which can be applied to any RF stub extending a quarter-wavelength, or less, beyond an RF junction between an RF interconnect and an RF signal path such as a center conductor of a stripline transmission line.

BRIEF DESCRIPTION OF THE DRAWINGS

The foregoing features of this invention, as well as the invention itself, may be more fully understood from the following description of the drawings in which.

Figure 1:
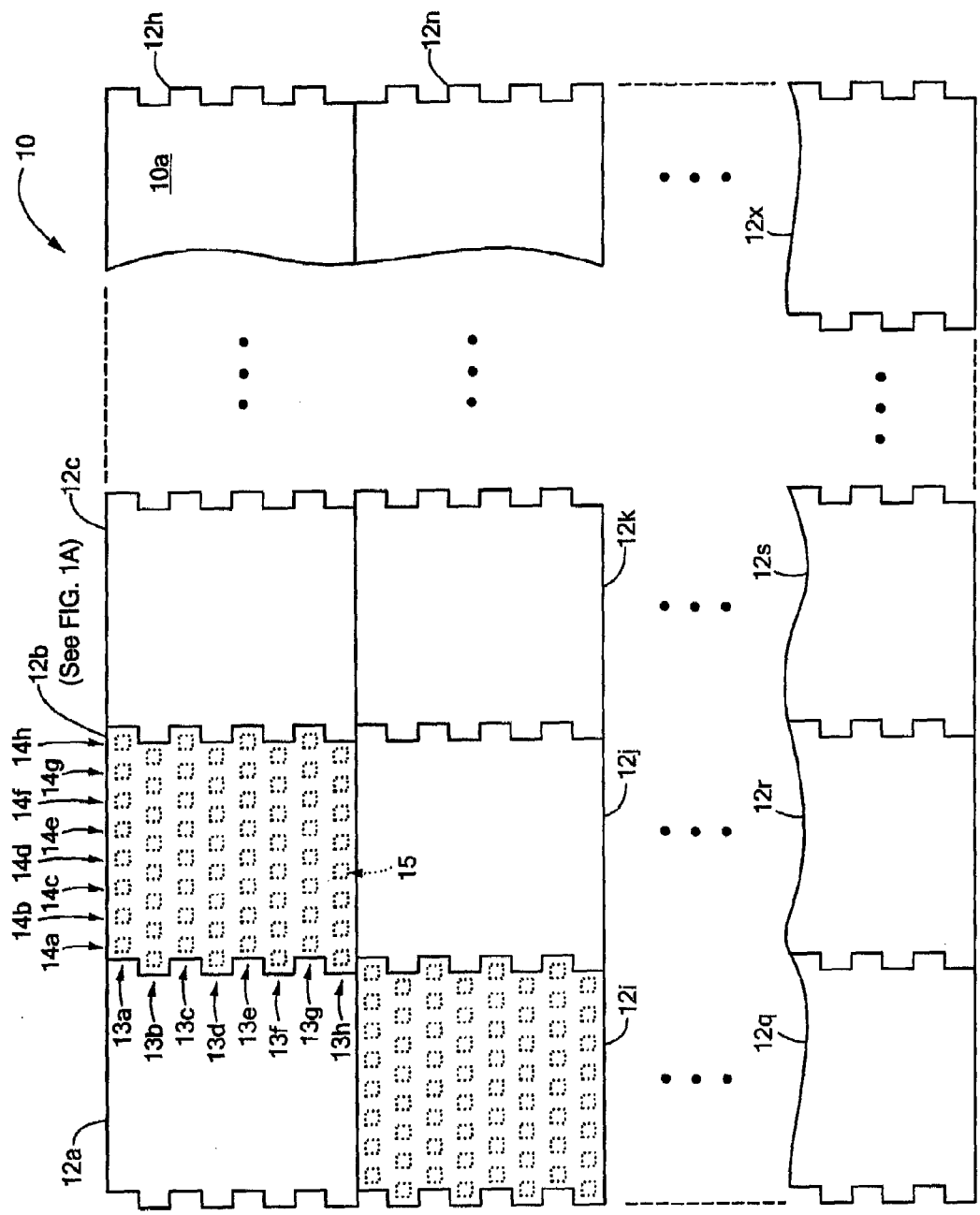
FIG. 1 is a plan view of an array antenna formed form a plurality of tile sub-arrays.

It should be understood that in an effort to promote clarity in the drawings and the text, the drawings are not necessarily to scale, emphasis instead is generally placed upon illustrating the principles of the invention.

DESCRIPTION OF THE PREFERRED EMBODIMENTS

Before describing the various embodiments of the invention, it should be noted that reference is sometimes made herein to an array antenna having a particular array shape and/or size (e.g., a particular number of antenna elements or a particular number of tiles) or to an array antenna comprised of a particular number of "tile sub-arrays" (or more simply "tiles"). One of ordinary skill in the art will appreciate that the techniques described herein are applicable to various sizes and shapes of array antennas.

Similarly, reference is sometimes made herein to tile sub-arrays having a particular geometric shape (e.g. square, rectangular, round) and/or size (e.g., a particular number of antenna elements) or a particular lattice type or spacing of antenna elements. One of ordinary skill in the art will appreciate that the techniques described herein are applicable to various sizes and shapes of array antennas as well as to various sizes and shapes of tile sub-arrays.

Thus, although the description provided herein below describes the inventive concepts in the context of an array antenna having a substantially square or rectangular shape and comprised of a plurality of tile sub-arrays having a substantially square or rectangular-shape, those of ordinary skill in the art will appreciate that the concepts equally apply to other sizes and shapes of array antennas and tile sub-arrays having a variety of different sizes, shapes, and types of antenna elements. Also, the tiles may be arranged in a variety of different lattice arrangements including, but not limited to, periodic lattice arrangements or configurations (e.g. rectangular, circular, equilateral or isosceles triangular and spiral configurations) as well as non-periodic or other geometric arrangements including arbitrarily shaped array geometries.

Reference is also sometimes made herein to the array antenna including an antenna element of a particular type, size and/or shape. For example, one type of radiating element is a so-called patch antenna element having a square shape and a size compatible with operation at a particular frequency (e.g. 10 GHz) or range of frequencies (e.g. the X-band frequency range). Reference is also sometimes made herein to a so-called "stacked patch" antenna element. Those of ordinary skill in the art will recognize, of course, that other shapes and types of antenna elements (e.g. an antenna element other than a stacked patch antenna element) may also be used and that the size of one or more antenna elements may be selected for operation at any frequency in the RF frequency range (e.g. any frequency in the range of about 1 GHz to about 100 GHz). The types of radiating elements which may be used in the antenna of the present invention include but are not limited to notch elements, dipoles, slots or any other antenna element (regardless of whether the element is a printed circuit element) known to those of ordinary skill in the art.

It should also be appreciated that the antenna elements in each tile sub-array can be provided having any one of a plurality of different antenna element lattice arrangements including periodic lattice arrangements (or configurations) such as rectangular, square, triangular (e.g. equilateral or isosceles triangular), and spiral configurations as well as non-periodic or arbitrary lattice arrangements.

Applications of at least some embodiments of the tile array architectures described herein include, but are not limited to, radar, electronic warfare (EW) and communication systems for a wide variety of applications including ship based, airborne, missile and satellite applications. For at least one embodiment of the tile sub-array, tile sub-arrays having a weight of less than one (1) ounce per transmit/receive (T/R) channel and a production cost of less than $100 per channel are desired. It should thus be appreciated that the tile sub-array described herein can be used as part of a radar system or a communications system.

As will also be explained further herein, at least some embodiments of the invention are applicable, but not limited to, military, airborne, shipborne, communications, unmanned aerial vehicles (UAV) and/or commercial wireless applications.

The tile sub-arrays to be described hereinbelow can also utilize embedded circulators; a slot-coupled, polarized egg-crate radiator; a single integrated monolithic microwave integrated circuit (MMIC); and a passive radio frequency (RF) circuit architecture. For example, as described further herein, technology described in the following commonly assigned United States Patents can be used in whole or in part and/or adapted to be used with at least some embodiments of the tile subarrays described herein: U.S. Pat. No. 6,611,180, entitled "Embedded Planar Circulator"; U.S. Pat. No. 6,624,787, entitled "Slot Coupled, Polarized, Egg-Crate Radiator"; and/or U.S. Pat. No. 6,731,189, entitled "Multilayer stripline radio frequency circuits and interconnection methods." Each of the above patents is hereby incorporated herein by reference in their entireties.

Referring now to FIG. 1, an array antenna 10 is comprised of a plurality of tile sub-arrays 12a-12x. It should be appreciated that in this exemplary embodiment, x total tile sub-arrays 12 comprise the entire array antenna 10. In one embodiment, the total number of tile sub-arrays is sixteen tile sub-arrays (i.e. x=16). The particular number of tile sub-arrays 12 used to provide a complete array antenna can be selected in accordance with a variety of factors including, but not limited to, the frequency of operation, array gain, the space available for the array antenna and the particular application for which the array antenna 10 is intended to be used. Those of ordinary skill in the art will appreciate how to select the number of tile sub-arrays 12 to use in providing a complete array antenna.

As illustrated in tiles 12b and 12i, in the exemplary embodiment of FIG. 1, each tile sub-array 12a-12x comprises eight rows 13a-13h of antenna elements 15 with each row containing eight antenna elements 15 (or more simply, "elements 15"). Each of the tile sub-arrays 12a-12x is thus said to be an eight by eight (or 8×8) tile sub-array. It should be noted that each antenna element 15 is shown in phantom in FIG. 1 since the elements 15 are not directly visible on the exposed surface (or front face) of the array antenna 10. Thus, in this particular embodiment, each tile sub-array 12a-12x comprises sixty-four (64) antenna elements. In the case where the array 10 is comprised of sixteen (16) such tiles, the array 10 comprises a total of one-thousand and twenty-four (1,024) antenna elements 15.

In another embodiment, each of the tile sub-arrays 12a-12x comprise 16 elements. Thus, in the case where the array 10 is comprised of sixteen (16) such tiles and each tiles comprises sixteen (16) elements 15, the array 10 comprises a total of two-hundred and fifty-six (256) antenna elements 15.

In still another exemplary embodiment, each of the tile sub-arrays 12a-12x comprises one-thousand and twenty-four (1024) elements 15. Thus, in the case where the array 10 is comprised of sixteen (16) such tiles, the array 10 comprises a total of sixteen thousand three-hundred and eighty-four (16,384) antenna elements 15.

In view of the above exemplary embodiments, it should thus be appreciated that each of the tile sub-arrays can include any desired number of elements. The particular number of elements to include in each of the tile sub-arrays 12a-12x can be selected in accordance with a variety of factors including but not limited to the desired frequency of operation, array gain, the space available for the antenna and the particular application for which the array antenna 10 is intended to be used and the size of each tile sub-array 12. For any given application, those of ordinary skill in the art will appreciate how to select an appropriate number of radiating elements to include in each tile sub-array. The total number of antenna elements 15 included in an antenna array such as antenna array 10 depends upon the number of tiles included in the antenna array and as well as the number of antenna elements included in each tile.

As will become apparent from the description hereinbelow, each tile sub-array is electrically autonomous (excepting of course any mutual coupling which occurs between elements 15 within a tile and on different tiles). Thus, the RF feed circuitry which couples RF energy to and from each radiator on a tile is incorporated entirely within that tile (i.e. all of the RF feed and beamforming circuitry which couples RF signals to and from elements 15 in tile 12b are contained within tile 12b). As will be described in conjunction with FIGS. 1B and 1C below, each tile includes one or more RF connectors and the RF signals are provided to the tile through the RF connector(s) provided on each tile sub-array.

Also, signal paths for logic signals and signal paths for power signals which couple signals to and from transmit/receive (T/R) circuits are contained within the tile in which the T/R circuits exist. As will be described in conjunction with FIGS. 1B and 1C below, RF signals are provided to the tile through one or more power/logic connectors provided on the tile sub-array.

The RF beam for the entire array 10 is formed by an external beamformer (i.e. external to each of the tile subarrays 12) that combines the RF outputs from each of the tile sub-arrays 12a-12x. As is known to those of ordinary skill in the art, the beamformer may be conventionally implemented as a printed wiring board stripline circuit that combines N sub-arrays into one RF signal port (and hence the beamformer may be referred to as a 1:N beamformer).

The tile sub-arrays are mechanically fastened or otherwise secured to a mounting structure using conventional techniques such that the array lattice pattern is continuous across each tile which comprises the array antenna. In one embodiment, the mounting structure may be provided as a "picture frame" to which the tile-subarrays are secured using fasteners (such as #10-32 size screws, for example). The tolerance between interlocking sections of the tile is preferably in the range of about +/−0.005 in. although larger tolerances may also be acceptable based upon a variety of factors including but not limited to the frequency of operation. Preferably, the tile sub-arrays 12a-12x are mechanically mounted such that the array lattice pattern (which is shown as a triangular lattice pattern in exemplary embodiment of FIG. 1) appears electrically continuous across the entire surface 10a (or "face") of the array 10.

It should be appreciated that the embodiments of the tile sub-arrays described herein (e.g. tile sub-arrays 12a-12x) differ from conventional so-called "brick" array architectures in that the microwave circuits of the tile sub-arrays are contained in circuit layers which are disposed in planes that are parallel to a plane defined by a face (or surface) of an array antenna (e.g. surface 10a of array antenna 10) made up from the tiles. In the exemplary embodiment of FIG. 1, for example, the circuits provided on the layers of circuit boards from which the tiles 12a-12x are provided are all parallel to the surface 10a of array antenna 10. By utilizing circuit layers that are parallel to a plane defined by a face of an array antenna, the tile architecture approach results in an array antenna having a reduced profile (i.e. a thickness which is reduced compared with the thickness of conventional array antennas).

Advantageously, the tile sub-array embodiments described herein can be manufactured using standard printed wiring board (PWB) manufacturing processes to produce highly integrated, passive RF circuits, using commercial, off-the-shelf (COTS) microwave materials, and highly integrated, active monolithic microwave integrated circuits (MMIC's). This results in reduced manufacturing costs. Array antenna manufacturing costs can also be reduced since the tile sub-arrays can be provided from relatively large panels or sheets of PWBs using conventional PWB manufacturing techniques.

In one exemplary embodiment, an array antenna (also sometimes referred to as a panel array) having dimensions of 0.5 meter×0.5 meter and comprising 1024 dual circular polarized antenna elements was manufactured on one sheet (or one multilayer PWB). The techniques described herein allow standard printed wiring board processes to be used to fabricate panels having dimensions up to and including 1m×1 m with up to 4096 antenna elements from one sheet of multilayer printed wiring boards (PWBs). Fabrication of array antennas utilizing large panels reduces cost by integrating many antenna elements with the associated RF feed and beamforming circuitry since a "batch processing" approach can be used throughout the manufacturing process including fabrication of T/R channels in the array. Batch processing refers to the use of large volume fabrication and/or assembly of materials and components using automated equipment. The ability to use a batch processing approach for fabrication of a particular antenna design is desirable since it generally results in relatively low fabrication costs. Use of the tile architecture results in an array antenna having a reduced profile and weight compared with prior art arrays of the same size (i.e. having substantially the same physical dimensions).

Figure 1A:
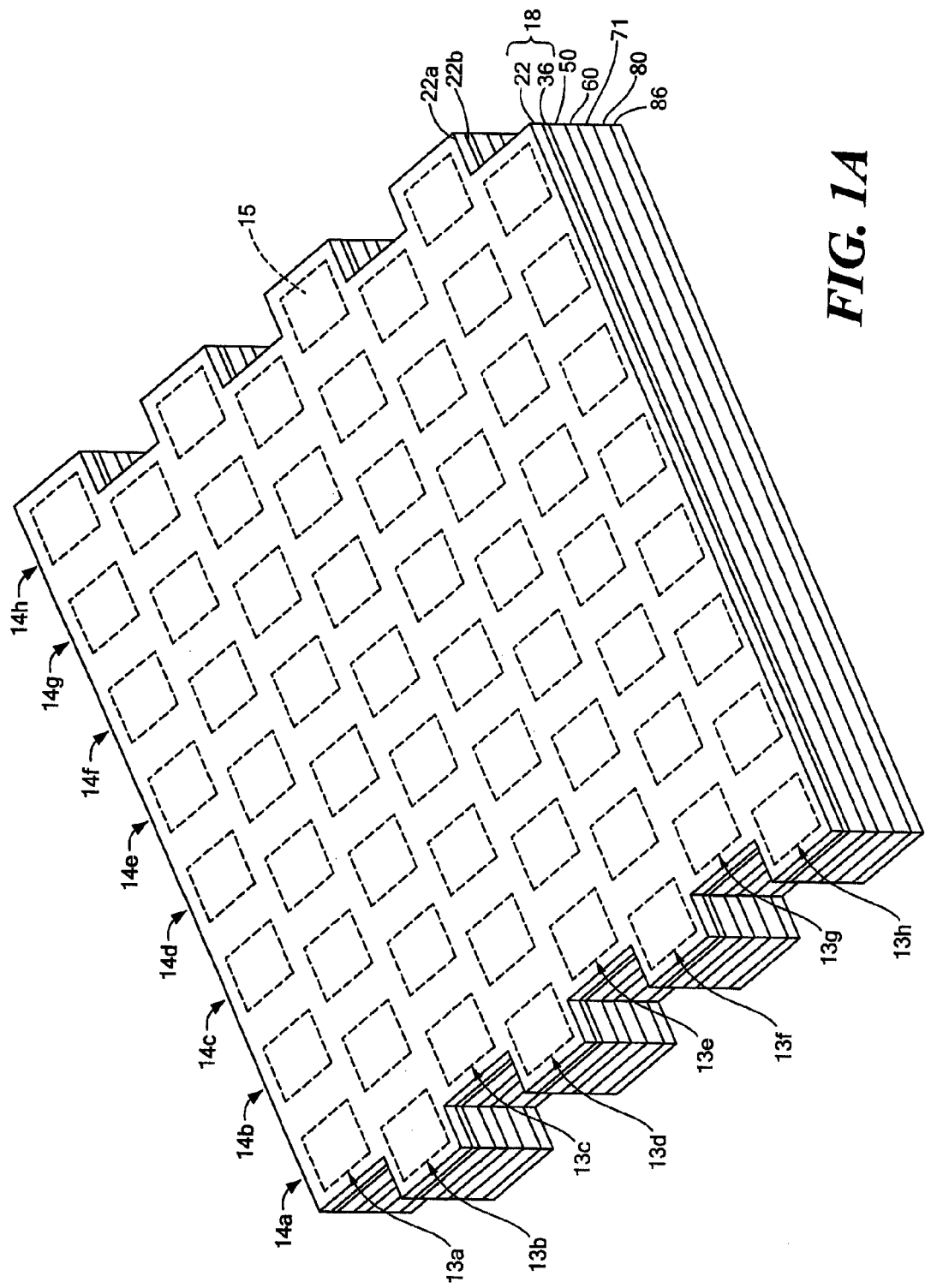
FIG. 1A is a perspective view of a tile sub-array of the type used in the array antenna shown in FIG. 1.

Referring now to FIG. 1A in which like elements of FIG. 1 are provided having like reference designations, and taking tile sub-array 12b as representative of tile sub-arrays 12a and 12c-12x, the tile sub-array 12b includes an upper multi-layer assembly (UMLA) 18. The UMLA 18 includes a radiator subassembly 22 which, in this exemplary embodiment, is provided as a so-called "dual circular polarized stacked patch egg-crate radiator" assembly which may be the same as or similar to the type described in U.S. Pat. No. 6,624,787 B2 entitled "Slot Coupled, Polarized, Egg-Crate Radiator" assigned to the assignee of the present invention and hereby incorporated herein by reference in its entirety. It should, of course, be appreciated that a specific type of radiator sub assembly is herein described only to promote clarity in the description provided by the drawings and text. The description of a particular type of radiator is not intended to be, and should not be construed as, limiting in any way. Thus, antenna elements other than stacked patch antenna elements may be used in the tile sub-array.

The radiator subassembly 22 is provided having a first surface 22a which can act as a radome and having a second opposing surface 22b. As will be described in detail below in conjunction with FIGS. 1B and 1C, the radiator assembly 22 is comprised of a plurality of microwave circuit boards (also referred to as PWBs) (not visible in FIG. 1A). Radiator elements 15 are shown in phantom in FIG. 1A since they are disposed below the surface 22a and thus are not directly visible in the view of FIG. 1A.

The radiator subassembly 22 is disposed over an upper multi-layer (UML) board 36 (or UMLB 36). As will be described in detail in conjunction with FIGS. 1B, 1C below, in the exemplary embodiment described herein, the UML board 36 is comprised of eight individual printed circuit boards (PCBs) which are joined together to form the UML board 36. It should, of course, be appreciated that in other embodiments, UML board 36 may be comprised of fewer or more that eight PCBs. The UML board 36 includes RF feed circuits which couple RF signals to and from the antenna elements 15 provided as part of the radiator subassembly 22.

Figure 1B:
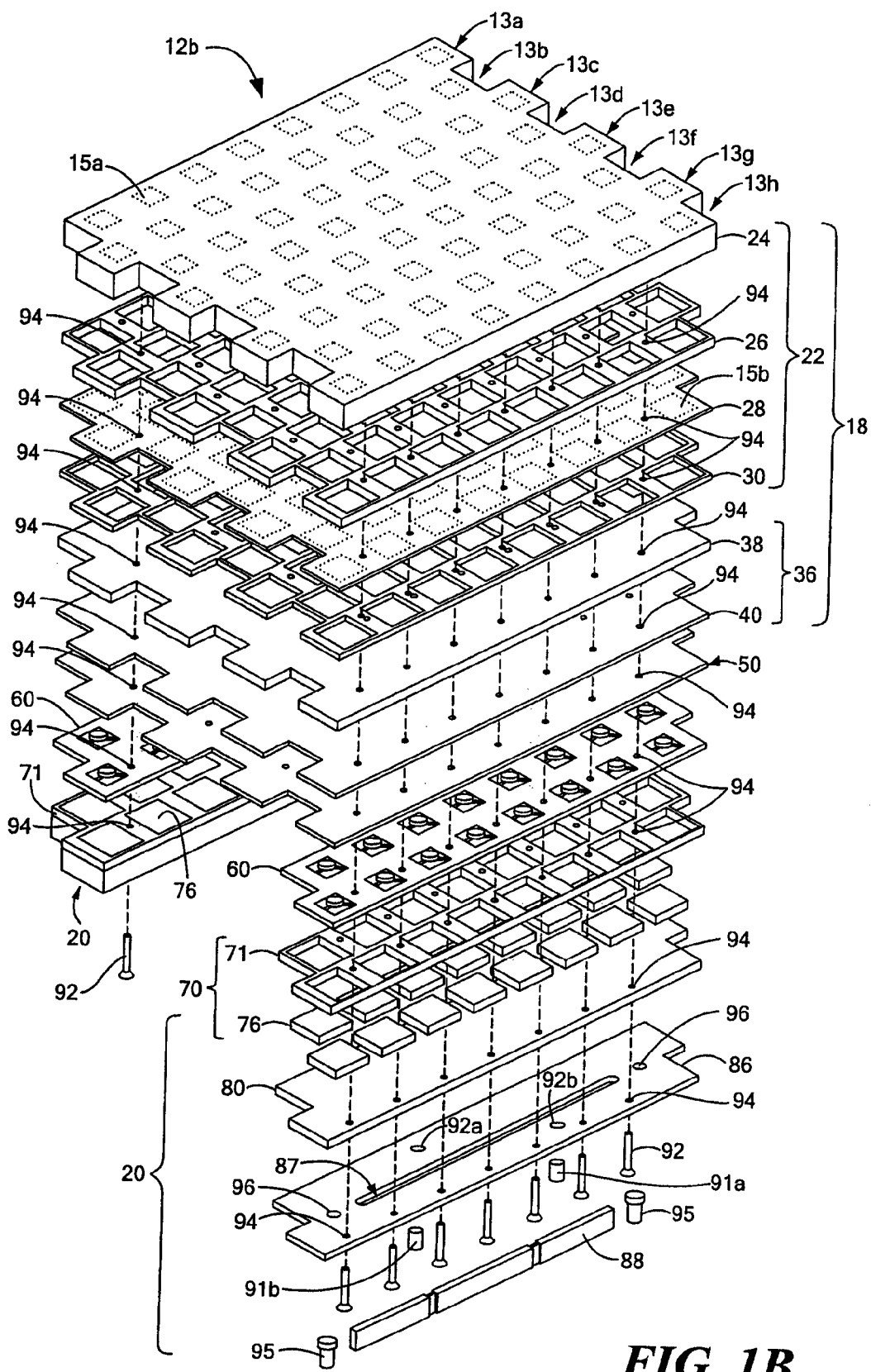
FIG. 1B is an exploded perspective view of a portion of the tile sub-array shown in FIG. 1A.

The UML board 36 is disposed over a first interconnect board 50 which in this particular embodiment is provided as a so-called "Fuzz Button" board 50. The interconnect board 50 is disposed over a circulator board 60 which in turn is disposed over a second interconnect board 71. As will be described in conjunction with FIG. 1B, the second interconnect board 71 may be provided as a so-called Fuzz Button, egg-crate board disposed over a plurality of T/R modules 76 (FIG. 1B). The Fuzz Button egg-crate board 71 is disposed over a lower multi-layer (LML) board 80 and the LML board 80 is disposed over a thermal spreader plate 86. The LML board 80 and thermal spreader plate 86 together with T/R modules 76 (not visible in FIG. 1A) comprise a lower multi-layer assembly 20 (LMLA 20).

The "fuzz-button" board 50 provides RF signal paths between circuits and signals on the UML board 36 and circulator board 60. Similarly, the "Fuzz-Button" egg-crate board 71 provides RF signal paths between the circulator board 60 and LML board 80. As will become apparent from the description hereinbelow in conjunction with FIG. 1B, the Fuzz-Button egg-crate board 71 is disposed over a plurality of T/R modules (not visible in FIG. 1A) provided on a surface of the LML board 80. The Fuzz Button board 50 as well as the Fuzz-Button egg-crate board 71 are each comprised of a number of coaxial RF transmission lines where each coaxial RF transmission line is comprised of a beryllium-copper wire spun in cylindrical shape and capable of being compressed (which forms a so-called fuzz button) and captured in a dielectric sleeve; the fuzz-button/dielectric sleeve assembly is then assembled into a metal board (e.g. as in board 50) or metal egg-crate. The fuzz-button board 50 and fuzz-button egg-crate 71 allow mechanical assembly of the UML board 36, circulator board 60, and the LML board 80. This is important for relatively large array antennas (e.g. array antennas having an array face larger than about one square meter (1 m$^2$) in area for ground based radar arrays) where relatively high yields are achieved by integrating "known good sub-assemblies" (i.e. subassemblies that have been tested and found to perform acceptably in the tests). However, for smaller arrays (e.g. array antennas having an array face smaller than about 1 m$^2$ in area for mobile radar arrays), the UML board 36, circulator board 60, and the LML board 80 can be mechanically and electrically integrated using a ball grid array interconnect method as described in U.S. Pat. No. 6,731,189, entitled "Multilayer Stripline Radio Frequency Circuits and Interconnection Methods" assigned to the assignee of the present invention and incorporated herein by reference in its entirety. Thus, this approach allows flexibility in assembly for the application and platform.

As mentioned above, the fuzz button board 50 is disposed over the circulator board 60. In this particular embodiment the circulator board 60 is provided as a so-called "RF-on-Flex circulator" board 60. The circulator board 60 may be the same as, or similar to, the type described in U.S. Pat. No. 6,611,180, entitled "Embedded Planar Circulator" assigned to the assignee of the present invention and hereby incorporated herein by reference in its entirety.

Circulator board 60 has provided therein a plurality of embedded circulator circuits which are disposed to impede the coupling of RF signals between a transmit signal path and a receive signal path provided in the tile sub array. That is, circulator board 60 functions to isolate a transmit signal path from a receive signal path.

The circulator board 60 is disposed over the second interconnect board 71 (aka fuzz button egg crate board 71) in which is disposed a plurality of transmit/receive (T/R) modules (not visible in FIG. 1A). The fuzz button egg crate board 71 is disposed to couple RF signals between the T/R modules (which are soldered or otherwise electrically coupled to circuits on the LML board 80) and the circulator board 60.

As mentioned above, the fuzz button egg crate layer 71 is disposed over the lower multi-layer (LML) board 80 and the LML board 80 is disposed over the thermal spreader plate 86 and the T/R modules 76, the lower multi-layer (LML) board 80 and the thermal spreader plate 86 together comprise the lower multi-layer assembly (LMLA) 20. It should be appreciated that in the particular exemplary embodiment shown in FIG. 1A, the fuzz button egg crate layer 71 is not included as part of the LMLA 20.

Figure 1C:
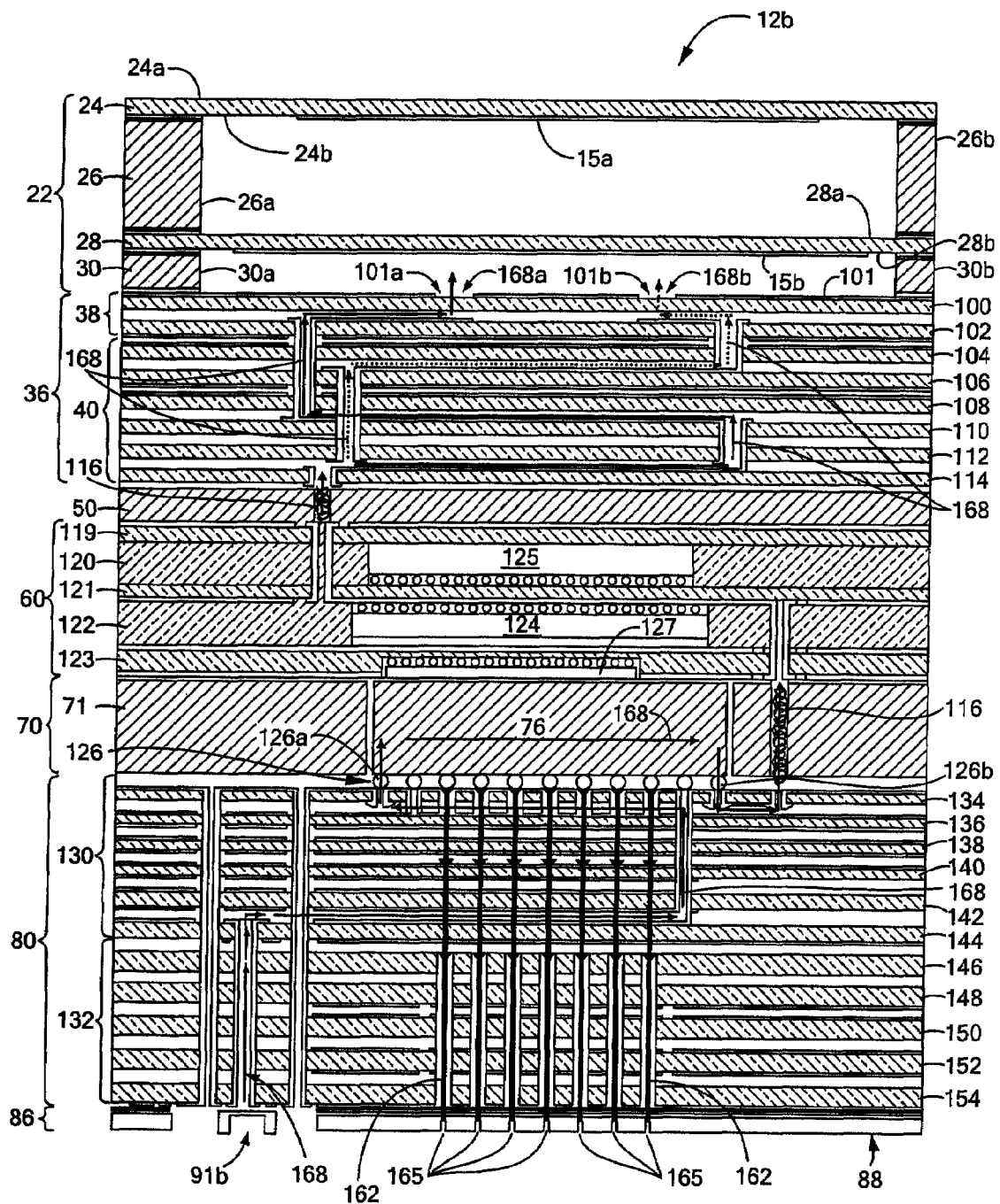
FIG. 1C is a cross-sectional view of a portion of the tile sub-array shown in FIGS. 1A and 1B.

Referring now to FIG. 1B in which like elements of FIGS. 1 and 1A are provided having like reference designations, the radiator subassembly 22 is comprised of a first radiator substrate 24, a first so-called "egg crate" substrate 26 (with egg crate walls 26a, 26b visible in FIG. 1C), a second radiator substrate 28 and a second egg crate substrate 30 (with egg crate walls 30a, 30b visible in FIG. 1C). The first substrate 24 includes a first plurality of radiating antenna elements 15a (the first plurality radiating elements 15a most clearly visible in FIG. 1C). The substrate 24 is disposed over the first so-called "egg-crate" substrate 26 with each of the radiating elements arranged such that they align with openings in the egg crate substrate 26.

The egg crate substrate 26 is disposed over a first surface 28a of a second substrate 28. A second opposing surface of the substrate 28b has a second plurality of radiating antenna elements 15b disposed thereon. The second plurality of radiating elements 15b are not directly visible in this view and thus are shown in phantom in FIG. 1B. The radiating elements 15a, 15b are clearly visible in the view of FIG. 1C. The first and second elements 15a, 15b taken together are generally denoted 15 in FIGS. 1 and 1A. The second substrate 28 is disposed over the second "egg-crate" substrate 30. The first and second egg crate substrates 26, 30 are aligned such that the openings in the second egg crate substrate 30 align with the openings in the first egg crate substrate 26. The set of antenna elements 15b on the second substrate 28 are arranged to align with openings in the second egg crate substrate 30.

The radiator sub-assembly 22 is disposed over a UML board 36 comprised of a plurality of boards 38, 40 which comprise RF feed circuits which couple RF signals between the antenna elements of the radiator sub-assembly 22 and RF transmitter and receiver circuitry to be described below. It should be appreciated that the RF feed circuit boards 38, 40 may themselves be comprised of multiple individual circuit boards which are bonded or otherwise coupled together to provide the UML board 36.

It should also be appreciated that the radiator sub-assembly 22 and the UML board 36 together form the UMLA 18. The UMLA 18 is disposed over and coupled to the LMLA 20. Specifically, the UML board 36 is disposed over a fuzz-button board 50, a circulator board 60 and a fuzz button egg crate board 71. Thus, in this particular embodiment, the fuzz-button board 50, circulator board 60 and fuzz button egg crate board 71 are disposed between the UMLA 18 and the LMLA 20. The fuzz-button board 50 facilitates RF connections between multiple vias of the circuit boards in the UMLA 18 and the circulator board 60; the fuzz-button egg-crate board 71 facilitates RF connections between the circulator board 60 and LMLA 20.

The fuzz button egg crate board 71 is disposed over T/R modules and a surface of the LMLB 80. It should be appreciated that in the exploded view of FIG. 1B, T/R modules 76 are shown separated from the LML board 80 but in practice, the T/R modules 76 are coupled to the LML board 80 using conventional techniques. The LML board 80 is disposed over a heat spreader plate 86 having a slot 87 formed along a portion of a centerline thereof.

The heat spreader plate 86, LML board 80 and T/R modules 76, together comprise the LMLA 20. A plurality of DC and logic connectors 88, 90 are disposed through the slot 87 and openings provided in the thermal spreader plate 86 and provide electrical input/output connections to the LMLA 20. A pair of RF connectors 91a, 91b are also disposed through holes 93a, 93b in the thermal spreader plate 86 to thus electrically connect with the LML board 80 and provide RF connection ports for the tile 12b.

The UMLA 18, the fuzz button board 50, the circulator board 60, the fuzz button egg crate board 71 and the LMLA 20 are each provided having a plurality of holes 94 therein. To promote clarity in the Figs., not every hole 94 has been shown and not every hole which has been shown has been labeled. At least portions of each of the holes 94 are threaded. A corresponding plurality of screws generally denoted 92 pass through holes 94 and the threads on screws 92 mate with the corresponding threads in the holes 94. Thus, screws 92 fasten together and secure the UMLA 18 to the LMLA 20 (as well as securing boards 50, 60 and 71 there between) to thus provide an assembled tile 12b. In the exemplary embodiment of FIG. 1B, the portions of the holes 94 in the radiator assembly 22 are threaded and the screws are inserted through the heat spreader plate 86 and the LMLA 20 and mate with the threaded portions of the holes 94 in the radiator assembly 22. Again to promote clarity in the Figs., not every screw 92 has been shown and not every screw which has been shown has been labeled.

It should be appreciated that to allow the screws 92 to pass through the holes 94, in each of the boards which comprise the UMLA 18 and the LMLA 20, the holes 94 in each of the boards must be aligned. Also, significantly, the holes 94 must be located in the boards so as to avoid any circuitry or circuit components provided in the boards which provide the tile 12b.

A pair of bosses 95 are coupled to the heat spreader plate at points 96 to provide points for mechanically interfacing with the tile 12b. In one embodiment the bosses 95 are threaded and are made available to accept either a liquid cold plate assembly or (as in this instance) a heat exchanger assembly (e.g. thermal spreader plate 86 to be described below) for thermal management by air cooling.

It should be appreciated that only two LMLAs 20 are shown in FIG. 1B and that a plurality of LMLAs 20 would be attached to the UMLA 18 to form a complete tile sub-array 12. In the exemplary embodiment of FIG. 1B, there would be four LMLAs 20 for one UMLA 22. In general, however, the number of LMLAs 20 required depends, at least in part, upon the number of radiating elements included the tile sub-array.

In this particular example, each tile sub-array 12 includes sixty-four radiating antenna elements which are uniformly distributed in a predetermined pattern (here a triangular lattice pattern) among eight rows of the sub-array (that is to say, each row of the tile sub-array includes the same number of antenna elements). In the exemplary design of FIGS. 1-1C, each LMLA 20 is adapted to couple to two rows of antenna elements 15 which constitutes sixteen (16) total antenna elements 15 (keeping in mind, of course that in FIG. 1B, each element 15 corresponds to a stacked patch element and that each stacked patch element 15 is comprised of two patch elements 15a, 15b). Stated differently, each LMLA 20 feeds a two-by-eight (2×8) portion of the sub-array 12b. Thus, since there are eight (8) rows of antenna elements in the tile sub-array 12b, and each LMLA feeds two rows, then four (4) LMLAs 20 are required to feed the entire sub-array 12b. Since, in this exemplary embodiment, each of the tile sub-arrays 12a-12x comprise eight (8) rows of antenna elements, then each of the tile sub-arrays 12a-12x requires four (4) LMLAs 20.

It should be understood that, in an effort to promote clarity in the description and the drawings, only two LMLAs 20 are shown in the exemplary embodiment of FIG. 1B. As explained above, however, in practice four LMLAs 20a-20d would be fastened to appropriate regions of the UMLA 18 to provide the complete tile 12b.

It should also be understood that although in this example each LMLA 20 feeds two (2) rows of antenna elements, it is possible to make an embodiment in which each LMLA feeds a number of antenna rows which is greater than or less than two. For example, assuming the tile sub-array contains eight rows as shown in FIGS. 1-1C, an LMLA configuration could be made to couple to one (1) row of antenna elements (in which case eight LMLAs per tile sub-array would be needed). Or alternatively, an LMLA configuration could be made to couple to four (4) rows of antenna elements (in which case two LMLAs per tile sub-array would be needed), or eight rows of antenna elements (in which case only one LMLA per tile sub-array would be needed). The particular number of LMLAs (i.e. the particular LMLA configuration) to use in any particular tile sub-array depends upon a variety of factors including but not limited to, the number of radiating elements in the tile sub-array, the cost of each LMLA, the particular application in which the tile sub-array will be used, the ease (or difficulty) of changing an LMLA in the sub-array (e.g. should an LMLA fail) and the cost of repairing, replacing or otherwise changing an LMLA in a tile sub-array should one fail. Those of ordinary skill in the art will understand how to select a particular LMLA configuration for a particular application.

Each LMLA may be associated with one or more T/R channels. For example, in the embodiment of FIGS. 1-1C, each LMLA 20 includes sixteen T/R channels arranged in a 2×8 layout coupled to a 2×8 array of antenna elements provided as part of the tile sub-array 12b. Thus, four such LMLAs 20 are used in a complete tile sub-array.

Referring now to FIG. 1C, in which like elements of FIGS. 1-1B are provided having like reference designations, the radiator assembly 22 is shown provided as a so-called "stacked patch" egg crate radiator sub-assembly 22 which comprises upper and lower patch radiators 15a, 15b with the first antenna element 15a disposed on a surface 24b of the board 24 and the second antenna element 15b disposed on a surface 28b of the board 28. The two boards 24, 28 are spaced apart by the egg-crate board 26. Details of a stacked patch radiator assembly which may be the same as or similar to radiator assembly 22 are described in U.S. Pat. No. 6,624,787 B2 entitled "Slot Coupled, Polarized, Egg-Crate Radiator" assigned to the assignee of the present invention The dual stacked-patch, egg-crate radiator assembly 22 is disposed over the UML board 36 which is provided from polarization and feed circuit boards 40, 38. The polarization and feed circuit boards 40, 38 are provided from a plurality of RF printed circuit boards 100-114. Circuit boards 100, 102 comprise antenna element feed circuits, circuit boards 104-110 comprise power divider circuits and circuit boards 112, 114 comprise the polarizing circuit. In this exemplary embodiment, the polarization, feed and power divider circuits are all implemented as printed circuits but any technique for implementing low cost, low profile, functionally equivalent circuits may also be used.

In this embodiment, circuit board 100 has a conductor disposed on a surface thereof. A pair of openings or slots 101a, 101b are formed or otherwise provided in the conductor 101 and RF signals are coupled to antenna elements 15a, 15b through the slots 101a, 101b. The tile sub-array thus utilizes a balanced feed circuit (not visible in FIG. 1C) which utilizes non-resonant slot coupling. The use of non-resonant slot coupling provides two benefits: first, use of slots (e.g. slots 101a, 101b) helps isolate the feed network from the antenna element (e.g. antenna elements 15a, 15b) which can substantially help prevent spurious radiation; and second, a non-resonant slot can substantially help eliminate strong back-lobe radiation (characteristic of a resonant slot) which can substantially reduce the gain of the radiator. In one embodiment in which the feed circuits are implemented as stripline feed circuits, the feed circuits and slots are isolated by plated through-holes (which act as mode suppression posts) provided in appropriate portions of the UML board 36.

UML board 36 (comprised of the polarization and feed circuit boards 40, 38) is disposed over the fuzz button board 50. Fuzz button board 50 includes one or more electrical signal paths 116 (only one electrical signal path 116 being shown in FIG. 1C). The electrical signal path 116 provides an electrical connection between circuits included as part of the UML board 36 (e.g. polarization and feed circuits) and circuits included on the circulator board 60.

The circulator board 60 is comprised of five circuit boards 119-123 a magnet 125 (which is provided as a samarium cobalt magnet in one embodiment) and a ferrite disk 124 (which is provided as a Garnett ferrite in one embodiment) and a pole piece 127 (which, in one embodiment, is provided as magnetizable stainless steel but which can be provided from any magnetizable material). Printed circuits provided on the circuit board 121 complete the circulator circuit and provide signal paths for RF signals propagating through the circulator. In one embodiment, the circulator may be implemented as the type described in U.S. Pat. No. 6,611,180 entitled Embebbed Planar Circulator and assigned to the assignee of the present invention and incorporated herein by reference in its entirety. The circulator board 60 is disposed over the "Fuzz Button" egg crate board 70.

It should be appreciated that in an array antenna having a brick style architecture, circulators such as the RF circulator shown in FIG. 1C, are typically incorporated into substrates included with each T/R channel.

In the present embodiment of the invention described herein, however, the design of the tile sub-array 12b removes the circulator from the T/R module and embeds it into a separate circulator board 60. For example, in the embodiment shown in FIG. 1C, the RF circulator components (e.g. the ferrite 124 the magnet 125 and the pole piece 127) can be "buried" or "embedded" in a layer of commercially available material such as a low loss and low dielectric constant polytetrafluoroethane (PTFE) based materials. Thus, circuit boards 119-123 may be provided as PTFE based circuit boards.

By providing the circulator as an embedded circulator (rather than as part of the T/R module), a significant reduction in T/R channel size is provided. By reducing the size of the T/R channel, a tighter lattice spacing in the antenna elements of the tile sub-array can be achieved. Tight lattice spacing is desirable since it is important in wideband phased array applications for achieving grating-lobe free scan volumes. Moreover, the embedded circulator can be provided utilizing commercial batch processing techniques and commercially available materials which results in a lower cost phased array.

The Fuzz-Button, egg-crate board 70 is provided from an egg crate board 71. A T/R module 76 is disposed in openings provided in the board 70. The T/R module is provided having a ball grid array (BGA) 126 provided thereon. The T/R module 76 includes a first signal port which is electrically coupled to ball 126a and a second signal port which is electrically coupled to ball 126b. The BGA 126 is electrically coupled (e.g. via soldering or any other technique for making electrical connections well known to those of ordinary skill in the art) to electrical circuits and signal paths provided in the LML board 80 over which the T/R module 76 is disposed. The board 71 also has a fuzz button signal path 116 provided therein through which RF signals may propagate from the second port of the T/R module 76 through ball 126b and an electrical signal path on the LML board 80 to the circulator board 60.

In this exemplary embodiment, the LML board 80 is comprised of two sets of printed circuit boards 130, 132 with each of the two sets 130, 132 themselves being comprised of a plurality of printed circuit boards 134-144 and 146-154. It should be noted, as will be understood by those of ordinary skill in the art, bonding adhesive layer are not shown as part of PCBs 130, 132 but are shown with PCBs 38 and 40 in the UMLB 36. In this embodiment, the circuit boards 130 (and hence circuit boards 134-144) correspond to the RF portion of the LML board 80 while the circuit boards 132 (and hence circuit boards 146-154) correspond to the DC and logic signal portion of the LML board 80 with board 154 being disposed on the thermal spreader plate 86.

A plurality of thermal paths designated by reference number 162 facilitate the transfer of heat from the T/R module 76 through the LML board 80 and to the thermal spreader plate 86 which in preferred embodiments is provided as a cooled thermal plate. In this embodiment, the heat spreader plate 86 is coupled to board 154 of the LML board 80 via a thermally conductive epoxy. Once boards 130, 132 are assembled (e.g. bonded or otherwise coupled together) to form the LML board 80, thermal pins 162 (only two of which are labeled in FIG. 1C) are shaken into holes in the LML board 80 until the barbed first end of the pins 162 are seated in the holes to ensure proper contact with the BGA 126. The second end of the pins 162 extend a short distance through the LML board 80 such that the second end of the pins 162 are disposed in holes 165 in the thermal spreader plate 86. The holes 165 are then filled with a thermally conductive epoxy. Thus, the BGAs 126 provide a means to accomplish the coupling of RF signals, DC and logic signals and thermal transfer from the T/R modules 76.

It should also be appreciated that other techniques, may of course, also be used to couple the spreader plate 86 to the LMLA 20. Also, it should be appreciated that regardless of the precise location of the spreader plate on the tile 12b and regardless of how the spreader plate is coupled to the tile 12b (e.g. thermally conductive epoxy, solder, thermal grease, etc. . . . ), it is preferred that thermal paths (such as thermal paths 162) couple heat generating devices such as T/R modules 76 to the heat sink such as spreader plate 86.

RF connector 91b is coupled to an RF signal path 168 in the LMLA 20. In this particular embodiment, the RF connector is provided as a GPPO connector but any RF connector having electrical and mechanical characteristics appropriately suited for a particular application may be used.

As indicated by the dashed line labeled with reference number 168, an RF signal fed into port 91b is coupled through the LML board 80 and is coupled through the BGA 126a to the T/R module 76. The RF signal propagates though the T/R module 76 and is coupled through the BGA 126b along a signal path between boards 134, 136 and to the signal path 116 in the fuzz button egg-crate board 70. The signal path 116 leads to the circulator board 60, through signal path 116 in board 50 and through a series of RF signal paths provided from circuits on the UML board 36. RF circuitry on the UML board 36 splits the signal 168 into two portions 168a, 168b which are coupled to the radiator layer 22. It should be appreciated the circulator board 60 and the T/R module 76 operate to make the system bi-directional. That is, port 91b may act as either an input port or an output port. In this manner, signals 168 are coupled to a column of antenna elements in the tile sub-array (e.g. column 14a of tile sub-array 12b shown in FIG. 1B).

As those skilled in the art will appreciate, the layers of the UMLA (and the LMLA as well) can be fabricated from virtually any PTFE based material having the desired microwave properties. For example, the present embodiment, the printed circuit boards included in the UMLA and LMLA are fabricated with material reinforced with woven glass cloth.

Figure 7:
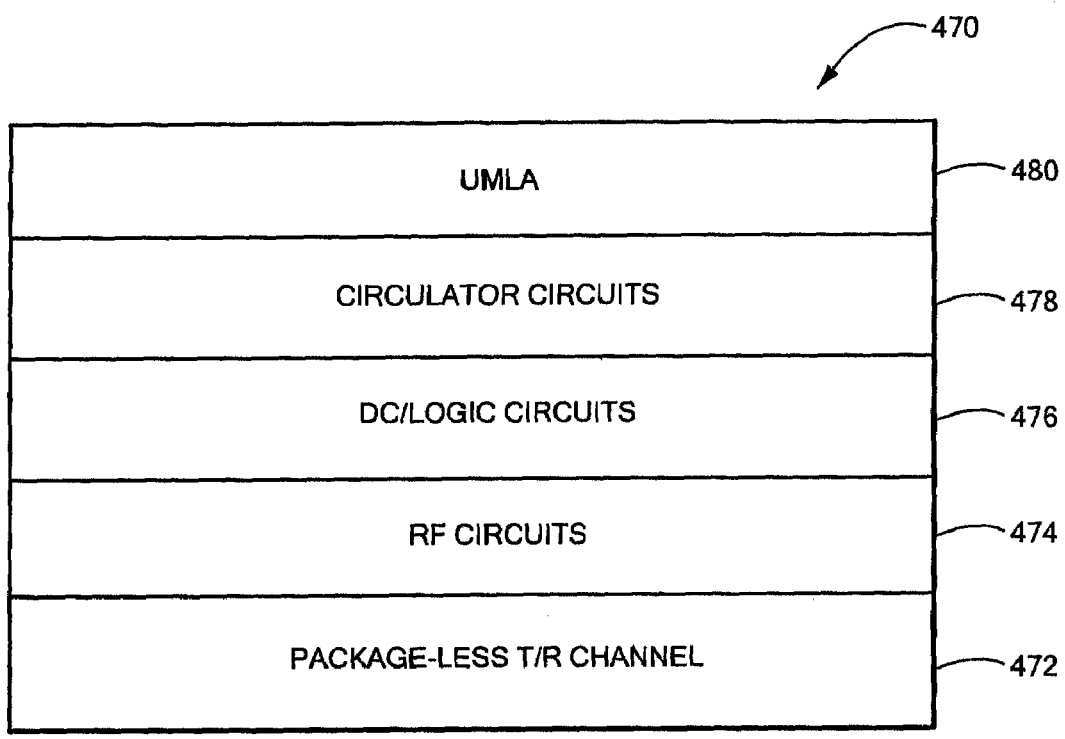
FIG. 7 is a block diagram of an alternate embodiment of a lower multi-layer assembly (LMLA) coupled to an upper multi-layer assembly (UMLA).

It should be appreciated that the LMLA integrates the package-less T/R channel and the embedded circulator layer sub-assembly. As mentioned above, in preferred embodiments, the LMLA is bonded to the UMLA using the ball grid array (BGA) interconnect approach. The package-less T/R channel eliminates expensive T/R module package components and associated assembly costs. One key building block of the package-Less LMLA is the Lower Multi-Layer Board (LMLB). The LMLB integrates RF, DC and logic signal distribution and an embedded circulator layer. All T/R channel MMIC's and components, RF, DC/Logic connectors and thermal spreader interface plate can be assembled onto the LMLA using pick and place equipment. FIG. 7 below illustrates a direct MMIC chip-attach embodiment in which MMIC chips are directly attached to a bottom layer of the LMLB for those applications in which it is desirable to have a relatively high peak transmit power per T/R channel.

Figure 2:
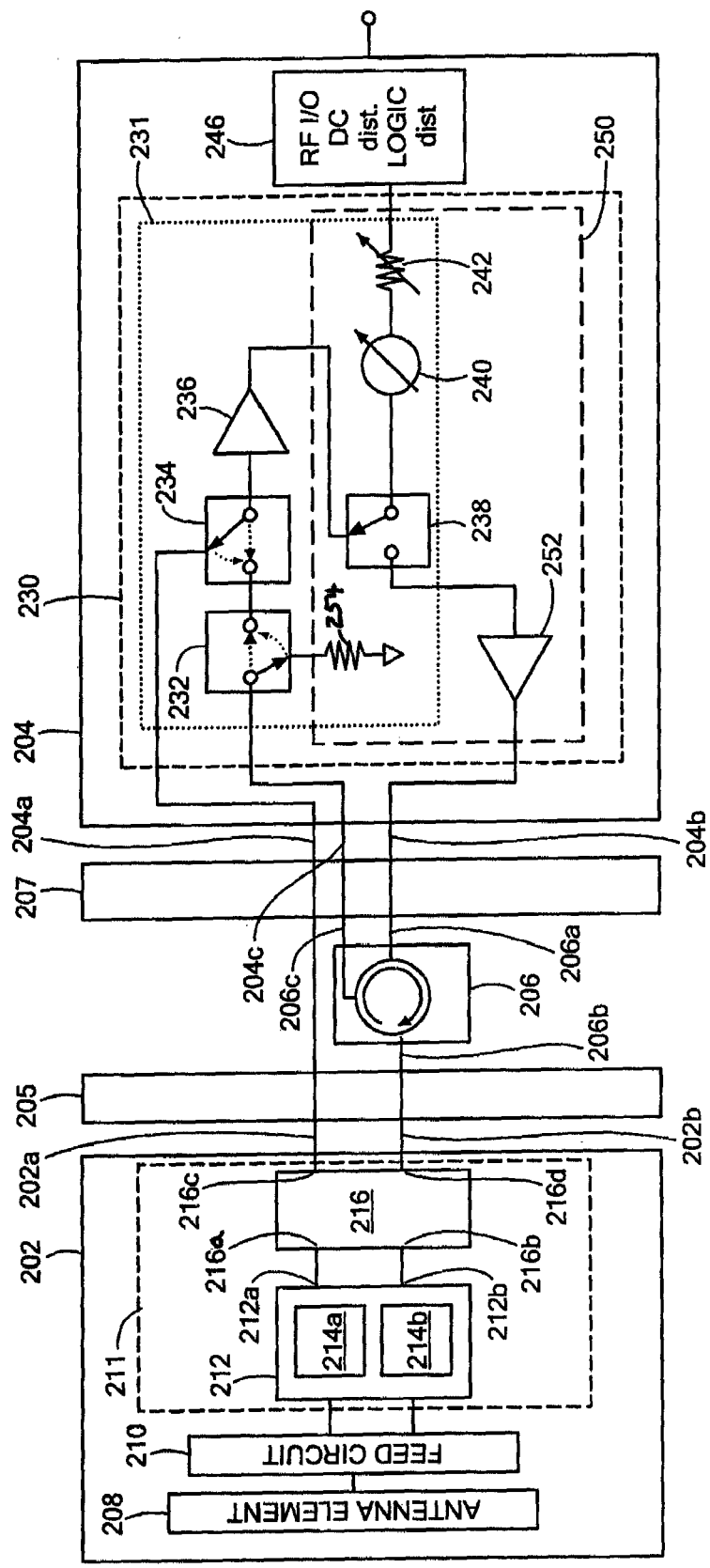
FIG. 2 is a block diagram of a portion of a dual circular polarized (CP) tile sub-array having a single transmit/receive (T/R) channel.

Referring now to FIG. 2, a portion of an exemplary tile sub-array 200 includes an upper multi-layer assembly (UMLA) 202 coupled to a lower multi-layer assembly (LMLA) 204 through a first interface 205, a circulator 206 and a second interface 207. Interface 205 may, for example, be provided as a type similar to Fuzz-button, interface 50 described above in conjunction with FIGS. 1A-1C; circulator 206 may be provided as a type similar to circulator board 60 described above in conjunction with FIGS. 1A-1C and interface 207 be provided as a type similar to fuzz-button, egg-crate interface 71 described above in conjunction with FIGS. 1A-1C.

The UMLA 202 illustrates the type of circuitry which may included in a UMLA such as the UMLA 18 described above in conjunction with FIGS. 1A-1C. The UMLA 202 includes antenna elements 208 electrically coupled to a feed circuit 210. In a preferred embodiment, the feed circuit 210 is provided as a balanced feed circuit. In this particular embodiment, the feed circuit 210 is shown as having a pair of ports coupled to an input of a polarization control circuit 211. In this particular embodiment, the polarization control circuit is provided from a power divider circuit 212 coupled to a quadrature hybrid circuit 216. Those of ordinary skill in the art will appreciate, however, that circuitry other than power divider circuits and hybrid circuits may be used to implement a polarization control circuit.

In the exemplary embodiment of FIG. 2, the divider circuit 212 is provided from a pair of Wilkinson power dividers 214a, 214b. In other embodiments, power dividers other than Wilkinson-type power dividers may also be used. Power divider circuit 212 has a pair of ports 212a, 212b coupled to respective ones of ports 216a, 216b of the quadrature hybrid circuit 216. A second pair of ports of 216c, 216d of the hybrid circuit 216 lead to UMLA ports 202a, 202b.

As mentioned above, UMLA 202 is intended to illustrate some of the circuitry included in a UMLA such as UMLA 18 described above in conjunction with FIGS. 1A-1C. It should thus be appreciated that to promote clarity in the figure and in the corresponding description, antenna elements 208 represents only those antenna elements which are coupled to the LMLA via the UMLA 202. Thus, element 208 in FIG. 2 may represent all of the antenna elements in a tile sub-array (e.g. in an embodiment in which the tile sub-array only includes a single LMLA) or alternatively, element 208 in FIG. 2 may represent only a portion of the total number antenna elements in a tile sub-array (e.g. in an embodiment in which the tile sub-array includes multiple LMLAs).

Stated differently, antenna elements 208 represent the portion of the antenna elements in a full tile sub-array which are coupled to the LMLA via the UMLA 202. As described above in conjunction with FIG. 1C, a tile sub-array (e.g. tile sub-array 12b in FIGS. 1-1C) may be provided from a single UMLA (e.g. UMLA 18 in FIGS. 1A-1C) and have multiple LMLAs coupled thereto. Alternatively, a tile sub-array (e.g. tile sub-array 12b in FIGS. 1-1C) may be provided from a single UMLA (e.g. UMLA 18 in FIGS. 1A-1B) and a single LMLA coupled thereto where the single LMLA includes the number of T/R modules needed to process all signals provided thereto from the UMLA.

It should be appreciated that LMLA 204 shown in FIG. 2 includes only a single transmit/receive (T/R) channel coupled to the antenna element 208 through the feed network 210. Thus, a single TR channel is coupled to a single antenna element. In other embodiments, however, a single TR channel may be coupled to a plurality of antenna elements. Also, although the LMLA is shown to include only a single T/R channel, in other embodiments, each LMLA may be provided having multiple T/R channels.

In practical systems a full tile sub-array will include a plurality of T/R channels and it should be appreciated that, in an effort to promote clarity in the description and the drawings, only a single channel is used in the exemplary embodiment of FIG. 2. Thus, illustration of the LMLA as including only a single T/R channel is not intended to be and should not be construed as limiting.

It should also be appreciated that FIG. 2 shows the elements of a single T/R channel which may be of the type included in one of the tile sub-arrays 12a-12x described above in conjunction with FIGS. 1-1C. Those of ordinary skill in the art will appreciate, of course, that each of the tile sub-arrays 12a-12X (FIG. 1) provided in accordance with various embodiments of the invention can, (and in general will), include a plurality of such T/R channels.

UMLA Ports 202a, 202b are coupled through interface circuit 205, circulator circuit 206 and interface 207 to ports 204a, 204b of the LMLA 204. In particular, interface circuit 206 includes signal paths through which RF signals can propagate from the UMLA to the LMLA. At least portions of the signal paths may be provided from so-called fuzz-button circuits as described hereinabove in conjunction with FIGS. 1A-1C.

The LMLA 204 includes a T/R module 230. The T/R module includes a receive signal path 231 and a transmit signal path 250. Signals from UMLA ports 202a, 202b are coupled to the receive signal path 231 at ports 204a, 204c. Signals having a first polarization are coupled from the UMLA 202 to port 204a and signals having a second different polarization are coupled from the UMLA 202 through circulator board 206 to port 204c.

The receive signal path includes a pair of single pole double throw (SPDT) switches 232, 234. The switches 232, 234 cooperate to couple a desired one of the two signals (each having different polarizations) from ports 204a, 204c to an input port of an amplifier 236 which in preferred embodiments is provided as a low noise amplifier (LNA) 236. With the switches 232, 234 positioned as shown in FIG. 2, signals at port 204a are fed to the input port of the LNA 236. With the switch arms of switches 232, 234 positioned as shown in dashed in FIG. 2, signals at port 204c are fed to the input port of the LNA.

Signals fed to the LNA 236 are appropriately amplified and coupled to a SPDT switch 238. The switch arm of the SPDT switch 238 can be placed in either a receive position or a transmit position. In a receive position (as shown in FIG. 2), the SPDT switch 238 provides a signal path from the output of the LNA 236 to an input of a phase shifter 240. Signals are coupled though the phase shifter to an amplitude control circuit 242 (e.g. an attenuator 242) to and RF I/O circuit 246. The circuit 246 couples RF, DC, and logic signals into an out of the T/R module 230.

The SPDT switch 238, the phase shifter 240 and the amplitude control circuit 242 are all also part of the transmit signal path 250. When the TR module is in a transmit mode of operation, the switch arm of the SPDT switch 238 is placed in the transmit position (i.e. so as to provide a low loss signal path between the phase shifter 240 and the input to the amplifier 252). With the arm of the switch 238 so positioned, signals from a transmit signal source (not shown in FIG. 2) are coupled through the RF portion of distribution circuit 246 through the attenuator 242, the phase shifter 240, the switch 238 to the amplifier which is preferably provided as a power amplifier 252.

The power amplifier provides an appropriately amplified signal (also referred to as a transmit signal) through interface 207 to port 206a of the circulator 206. A second port 206b of the circulator 206 is coupled through interface 205 to UMLA port 202b and a third port 206b of the circulator is coupled to the termination 254 through the switch 232.

The transmit signal is then coupled through the polarization control circuit 211 to the feed circuit 210 and finally to the antenna elements 208 which emit an RF transmit signal.

It should be appreciated that the T/R module 76 contains substantially all of the active circuitry in the tile sub-array 12. As described above in conjunction with FIGS. 1-1C, the T/R module 76 includes transmit and receive signal paths and each path is coupled to the beamformer in the LMLA 20.

In one embodiment, the LNA 236 may be provided as a compact Gallium Arsenide (GaAs) Low Noise Amplifier and the power amplifier 252 may be provided as a compact GaAs Power Amplifier. Although not shown in FIG. 2, in some embodiments, the TR module may also include a Silicon Germanium (SiGe) control monolithic microwave integrated circuit (MMIC) to control some or all of switches 232, 234, 238, phase shifter 240 or amplitude control circuit 242.

Figure 3:
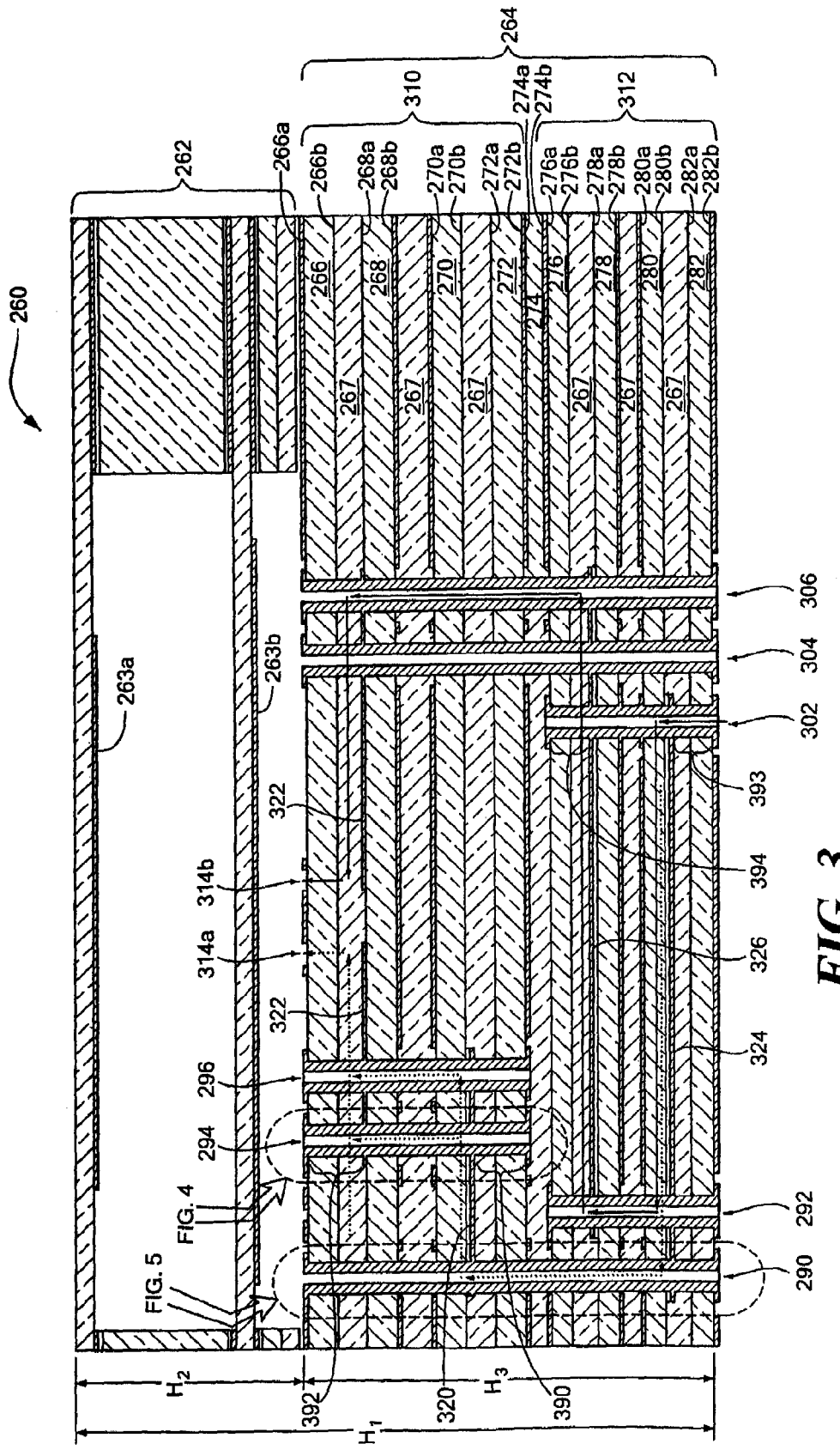
FIG. 3 is a cross-sectional view of an upper multi-layer assembly (UMLA) of the type shown in FIG. 1C.

Referring now to FIG. 3, a UMLA 260 is comprised of an egg-crate radiator assembly 262 (which may be the same as or similar to assembly 22 described above in conjunction with FIGS. 1-1C) disposed over a UMLB 264. UMLB 264 is comprised of two subassemblies 310, 312. Each of the subassemblies 310, 312 are fabricated and then coupled via layer 274 to provide the UMLB 264. In preferred embodiments, the layer 274 corresponds to a bonding layer 274. In one particular embodiment, the layer 274 corresponds to a bonding layer 274 provided as a Cyanate Ester resin B-stage (e.g. the type manufactured by W. L. Gore & Associates and sold under the trade name Speedboard-C®). The egg-crate radiator and UMLB subassemblies 262, 264 are then bonded or otherwise secured together to provide the UMLA 260. The Egg-Crate Radiator 262 and UMLA 264 may be secured together accomplished via a conductive epoxy bond film. Those of ordinary skill in the art will appreciate, of course, that any other bonding or fastening technique well known to those of ordinary skill in art and appropriate for securing together microwave circuit subassemblies may also be used. It should be appreciated that in preferred embodiments, the UMLA 260 is provided as a bonded assembly. However, in accordance with the present invention, the final bonded UMLA assembly is the result of multiple lamination, bonding and assembly processes.

The multi-step lamination, fabrication and assembly process for the UMLA results in several advantages: (a) each subassembly 262, 310, 312 may be separately tested and any subassembly 262, 310, 312 which does not meet or exceed desired electrical and/or mechanical performance characteristics may be identified and either repaired or not used to form a UMLA; (b) each subassembly 310, 312 may be separately tested and any subassembly 310, 312 which does not meet or exceed desired electrical and mechanical performance characteristics may be identified and either repaired or not used to form a UMLB; (c) separate fabrication of sub-assemblies 262, 310, 312 allows the fabrication process for each subassembly to be separately optimized for maximum yield of that subassembly; (d) since only known "good" subassemblies 310, 312 are used to fabricate UMLBs, this results in a high-yield UMLB fabrication process; (e) since only known "good" subassemblies 262, 310, 312 are used to fabricate UMLAs, this results in a high-yield UMLA fabrication process; and (f) separate fabrication of sub-assemblies 262, 310, 312 which are then secured together via bonding layers results in a wider choice of bonding adhesives and bonding temperatures for each subassembly 262, 310, 312 which leads to improved mechanical performance for each subassembly 262, 310, 312. Thus, the fabrication and assembly approach developed for the UMLA 260 produces a robust mechanical design that significantly improves manufacturing yield.

In one particular embodiment, the egg-crate radiator 262 and UMLB 264 sub-assemblies are both 0.5 m×0.5m and thus the UMLA is 0.5 meters (m) long by 0.5 m wide (19.7 in.× 19.7 in). The UMLA 260 is provided having a thickness or height $H_1$ typically of about 0.25 inches and comprises 1024 dual circular polarized RF channels with each RF channel weighing about 0.16 ounces (4.65 gr.). Furthermore, with the above-described multi-step lamination and fabrication process, each circuit layer of the UMLA can be fabricated using PWB industry standard processes and fabrication tolerances and commercially available materials.

In one embodiment, the two subassemblies 310, 312 are comprised of laminated layers of ten-mil thick Taconic RF-30 dielectric circuit boards 266, 268, 270, 272, 276, 278, 280, 282 separated by 2 mil thick layers of FEP bonding adhesive 267. As mentioned above, the bond between the egg-crate radiator 262 and UMLB 264 can be accomplished via a conductive epoxy film. In a preferred approach, the subassemblies 310, 312 are first secured together to form the UMLB 264 (i.e. boards 310, 312 are bonded using Speedboard-C® bonding adhesive between ground planes separating the subassemblies 310, 312) and the UMLB 264 is then secured to the egg-crate radiator 262 to form the UMLA 260.

It should be appreciated that UMLB 264 includes a plurality of vertical interconnects 290-306. The vertical interconnects 290-306 are also sometimes referred to herein as "RF vias." The RF vias 290-306 provide RF signal paths between circuits or signal paths provided on the different layers of the circuit boards 266-282 which comprise the UMLB 264.

For example, in subassembly 310, circuit board 270 is provided having a 50 ohm input port to 25 ohm output port Wilkinson resistive divider disposed on layer 270b thereof (only a portion 320 of the resistive divider is visible in the cross-sectional view of FIG. 3). The portion 320 of the resistive divider is coupled through RF vias 294, 296 to a stripline feed circuit 322 on layer 268a of circuit board 268 (only a portion only a portion of the feed circuit 322 being visible in the cross-sectional view of FIG. 3). The feed circuit 322 then provides RF signals to one or more slot radiators 314a. The slot radiators excite a pair of stacked patch radiators provided as part of the egg-crate radiator sub-assembly 262.

Similarly, subassembly 312 includes a 50 ohm input port to 50 ohm output port three branch quadrature hybrid circuit 324 on layer 280b of circuit board 280 and a 50 ohm input port to 25 ohm output port Wilkinson resistive divider 326 on layer 278a of circuit board 278 (only portions of the circuits 324, 326 being visible in FIG. 3). The quadrature hybrid 324 splits an input signal fed thereto and provides a ±90° phase relationship necessary to provide polarization control in the antenna (e.g. in a polarization control circuit such as that described above in conjunction with FIG. 2). In particular, the ±90° phase relationship is necessary to achieve left hand and right hand circular polarization in the antenna. The Wilkinson resistive dividers 320 and 326 split the signal again to provide spatially orthogonal signals that feed the radiators 263a, 263b in the subassembly 262. The resistors improve axial ratio performance as the array is scanned off bore sight by terminating odd-mode excitation at the Wilkinson ports feeding 294, 296 and 304, 306. The resistors can be provided, for example, as part of the copper film such as Omega-ply® or could be applied as an ink or chip resistor directly to the copper circuit on the dielectric material of the circuit board. The RF interconnects 290, 302 electrically couple together the quadrature hybrid circuits 324 and the Wilkinson divider circuits 320 and 326 provided on layers 270b, 278a.

It should be appreciated that RF interconnects 294, 296 interconnect circuits provided on layers within a single subassembly of the UMLB 264 (i.e. subassembly 310). Similarly, RF interconnects 292, 302 interconnect circuits provided on different layers within subassembly 312 (i.e. a single subassembly of the UMLB 264).

RF interconnects 290, 304 and 306, however, interconnect circuits provided on different layers within different subassemblies of the UMLB 264. For example, the RF interconnects 304, 306 electrically couple together Wilkinson divider circuits 326 provided on layers 278a and feed circuits 322 provided on layer 268a while RF interconnect 290, electrically couples together quadrature hybrid circuits 324 provided on layers 280b and divider circuits 320 provided on layer 270b. Since RF interconnect 290, as well as RF interconnects 304, 306, extend from the bottom-most layer of the UMLB 264 (i.e. layer 282b) to the top-most layer of the UMLB 264 (i.e. layer 266a), the RF interconnect 290, 304, 306 can couple circuits on any layer on the UMLB 264.

As mentioned above, for reasons including, but not limited to the cost of manufacturing the UMLA 260, it is desirable to use standard PWB manufacturing processes to fabricate subassemblies 310, 312 of the UMLB 264.

When using such manufacturing techniques, however, an RF "stub" is produced from the standard drilling and plating process to produce an RF via (as well as mode suppression vias which can be provided surrounding the RF via as is generally known). The RF stub is that part of the RF via extending above and/or below an intersection (or junction) between the RF via and a transmission line conductor (e.g. the center conductor of a stripline RF transmission line). RF stubs are produced when two (or more) RF transmission lines are connected.

In the UMLA of FIG. 3, there are four distinct RF stubs produced in the UMLB from drilling and plating an RF via to connect two inner circuit layers. First, in subassembly 310, stubs 390, 392 occur in the connection between the upper Wilkinson divider circuit layer (e.g. circuit 320 on layer 270b) and the feed circuit layer (e.g. circuit 322 on layer 268a). Second, in subassembly 312, stubs 393, 394 occur in the connection between the quadrature hybrid circuit layer (e.g. circuit 324 on layer 280b) to the lower Wilkinson divider circuit layer (e.g. circuit 326 on layer 278a). Third, the stubs 420 (FIG. 5) and 422 occur in the connection between the quadrature hybrid circuit layer (e.g. circuit 324 on layer 280b) and the upper Wilkinson divider circuit layer (e.g. circuit 320 on layer 270b). Fourth, although not shown in FIG. 3, stubs can occur as a result of connections between the lower Wilkinson circuit layer (i.e. layer 278a) and the feed circuit layer (i.e. layer 268a). It should be appreciated that the third and fourth situations occur when subassembly 310 is bonded or otherwise secured to subassembly 312. Thus, the stubs can occur as a result of the connections between circuits on different layers within in a single subassembly or as a result of the connections between circuits on different layers in multiple subassemblies.

In conventional microwave assemblies having multiple circuit boards and circuit layers, the RF stubs are removed by a separate so-called "back-drill operation" in which the stub portion of the RF via is physically removed by drilling the RF via using a drill diameter larger than the diameter of the RF via. The resulting hole remaining after the drilling operation is back-filled with a non-conductive epoxy.

This added manufacturing step (i.e. the back-drill operation) has two consequences. First, RF performance is degraded by the dielectric "stub" extending beyond the RF junction. The epoxy filling typically does not match the surrounding microwave laminate electrical properties of dielectric constant and loss and mechanical properties such as the coefficient of thermal expansion in the x, y and z directions are not matched between the epoxy and microwave laminate. Thus, the operating bandwidth of the RF interconnect is reduced and channel to channel tracking of RF performance (return loss, insertion loss) is degraded. Second, the process adds significant cost and lead time. These two consequences are a result of at least manufacturing tolerances and variations between the electrical and mechanical characteristics of the fill material and the circuit boards and reduce the system performance capabilities.

The tile sub-array of the present invention, however, eliminates back-drill and back-fill of all RF via stubs by utilizing an "RF matching pad" whereby the RF via stubs are electrically "matched" over the RF operating frequency band. The RF matching pad technique is a technique in which conductive material is provided on the blank layers (i.e., layers with no copper) or in ground plane layers (with relief areas) enabling a standard, low aspect ratio drill and plate manufacturing operation to produce an RF via that connects inner circuit layers and produces a low insertion loss RF transition across X-Band (8 GHz-12 GHz). With the RF Matching Pad approach, all RF and mode suppression vias can be are drilled and plated through the entire assembly at the same time. Manufacturing costs associated with back drill and back fill operations are completely eliminated. Moreover, RF performance has been improved because channel to channel variations due to drill tolerances and backfill material tolerances have been eliminated.

In the embodiment of FIG. 3, RF matching pads are provided from conductive disks (surrounded by an annular ring relief area) in ground plane circuit layers (i.e. layers 266a, 268b, 270a, 272b, 274a, 278b, 280a, and 282b). The RF matching pad technique is a general approach which can be applied to any RF stub extending a quarter-wavelength, or less, beyond an RF junction formed by an intersection of an RF interconnect and an RF transmission line.

Figure 4:
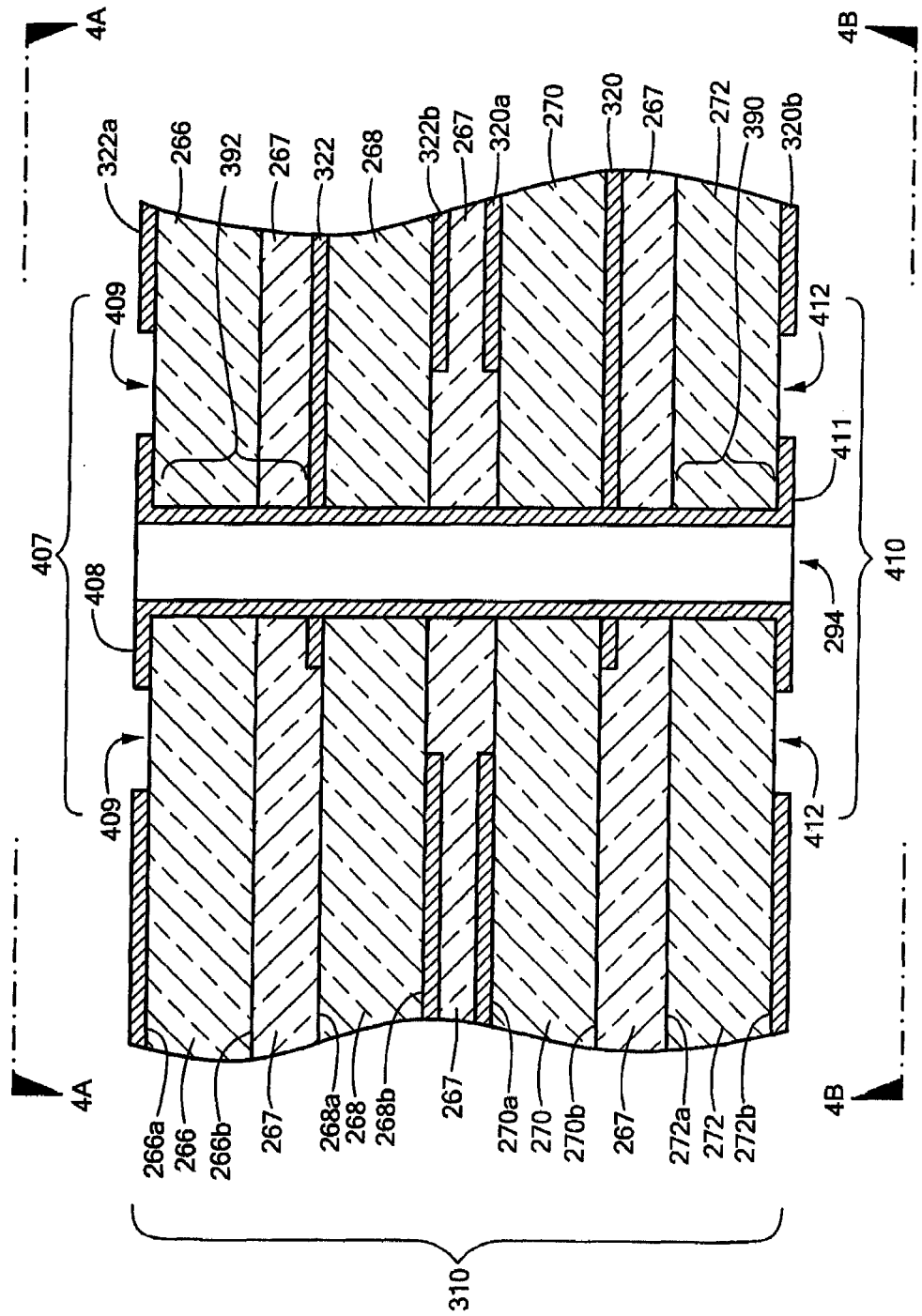
FIG. 4 is an enlarged cross-sectional view of the transition shown in FIG. 3.
Figure 4A:
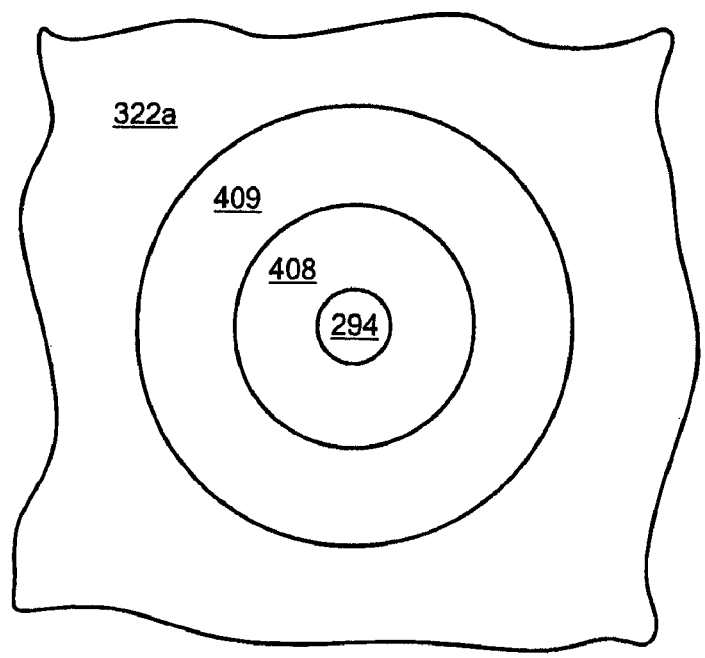
FIG. 4A is a top view of the cross-section in FIG. 4
Figure 4B:
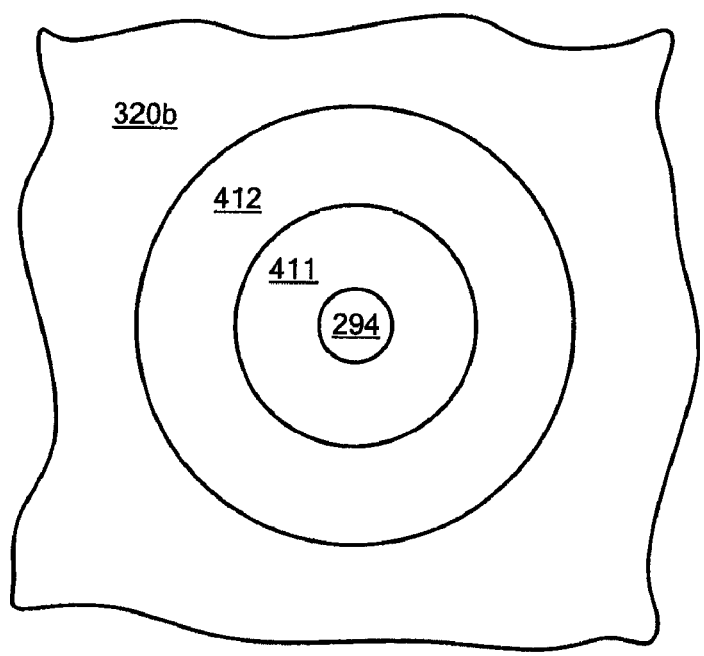
FIG. 4B is a bottom view of the cross-section in FIG. 4
Figure 4C:
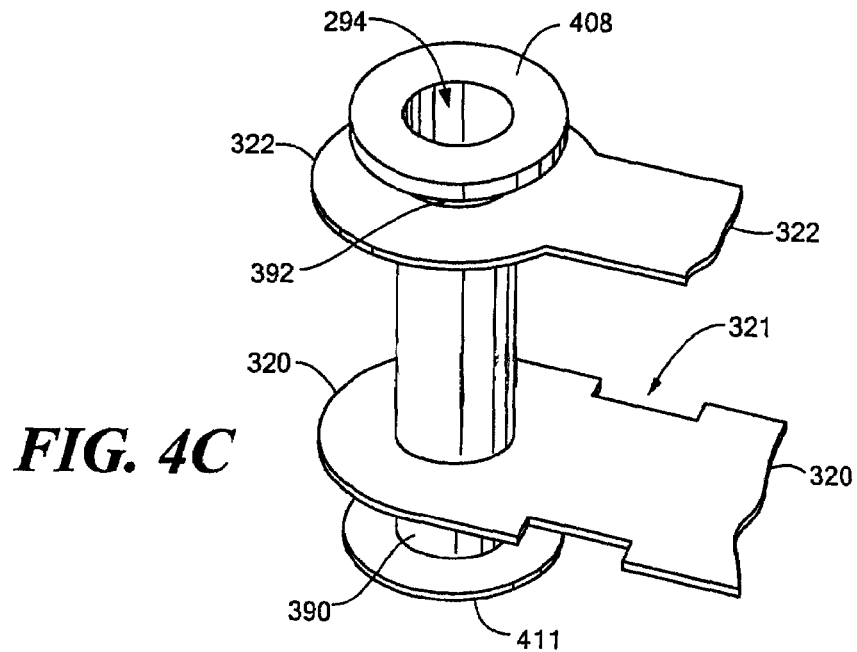
FIG. 4C is an enlarged perspective view of the RF transition shown in FIG. 3.

Referring now to FIGS. 4-4C in which like elements of FIG. 3 are provided having like reference designations, RF interconnect 294 can be clearly seen to extend from a first end on layer 266a of circuit board 266 to a second end on layer 272b of circuit board 272. As discussed above in conjunction with FIG. 3, RF interconnect 294 couples transmission line 320 on circuit layer 270b to transmission line 322 on circuit layer 268a. It should be appreciated that in the embodiment shown in FIGS. 3 and 4, the RF transmission lines 320, 322 each correspond to center conductors of a stripline transmission line with conductors 320a, 320b and 322a, 322b, respectively, corresponding to the ground planes of the stripline configuration.

A first RF stub 390 occurs as a result of the junction (or intersection) between transmission line 320 and RF interconnect 294 and a second RF stub 392 occurs as a result of the junction (or intersection) between transmission line 322 and RF interconnect 294. The first end of RF interconnect 294 is provided having an RF matching pad 407 provided from a first conductive region 408 coupled to RF interconnections 294. In this exemplary embodiment, the first conductive region of the RF matching pad is provided as a disk-shaped conductor 408. The first conductive region (e.g. disk-shaped conductor 408) is surrounded by a non-conductive relief area 409 which electrically isolates conductor 408 from the ground plane 322a. In this exemplary embodiment, the relief area 409 is provided as an annular ring defined by an a first inner diameter and a second or outer diameter.

Similarly, the second end of RF interconnect 294 is provided having an RF matching pad 410 provided from a first conductive region 411 surrounded by a non-conductive relief area 412 which separates ground plane 320b from the conductor 411.

The size and shape of the RF matching pads 407, 410 are selected to "tune" (or "match") any impedance and/or transmission characteristics of the respective RF stubs 392, 390. It should be appreciated that RF matching pad 407 need not be the same size or shape as the RF matching pad 410. That is, the diameters of the disks 408, 411 need not be the same. Also, the inner and outer diameters of the annular rings 409, 412 need not be the same. Rather, each RF matching pad 407, 410 is provided having a shape and dimensions (i.e. a size) which most effectively provides RF interconnect 294 having desired mechanical and electrical performance characteristics.

Also, as illustrated in conjunction with FIGS. 6 and 6A below, the shape of the first conductive region of the RF matching pad need not be a disk. Rather the first conductive region of the RF matching pad may be provided having any regular or irregular geometric shape. Likewise, the relief regions (e.g. regions 409, 412) need not be provided having an annular shape. Rather the relief regions may be provided having any regular or irregular geometric shape as long as the relief regions substantially electrically isolate the first conductive region of the RF matching pad (e.g. regions 408, 411) from the ground planes on the layer on which the first conductive regions occur. For example, as shown in FIG. 4, ground plane 322a is on the same circuit layer as conductive region 408. Thus, relief region 409 (regardless of its size and/or shape and/or the size and/or shape of the conductive region 408) should electrically isolate conductive region 408 from the ground plane conductor 322a.

It should also be appreciated that RF matching pads may be utilized with impedance matching sections of transmission line as illustrated by transmission line section 321 in FIG. 4C. The effect of the impedance characteristics of the matching section 321 should be taken into account when designing (i.e. selecting the shape and dimensions) of the RF matching pad 410.

Figure 4D:
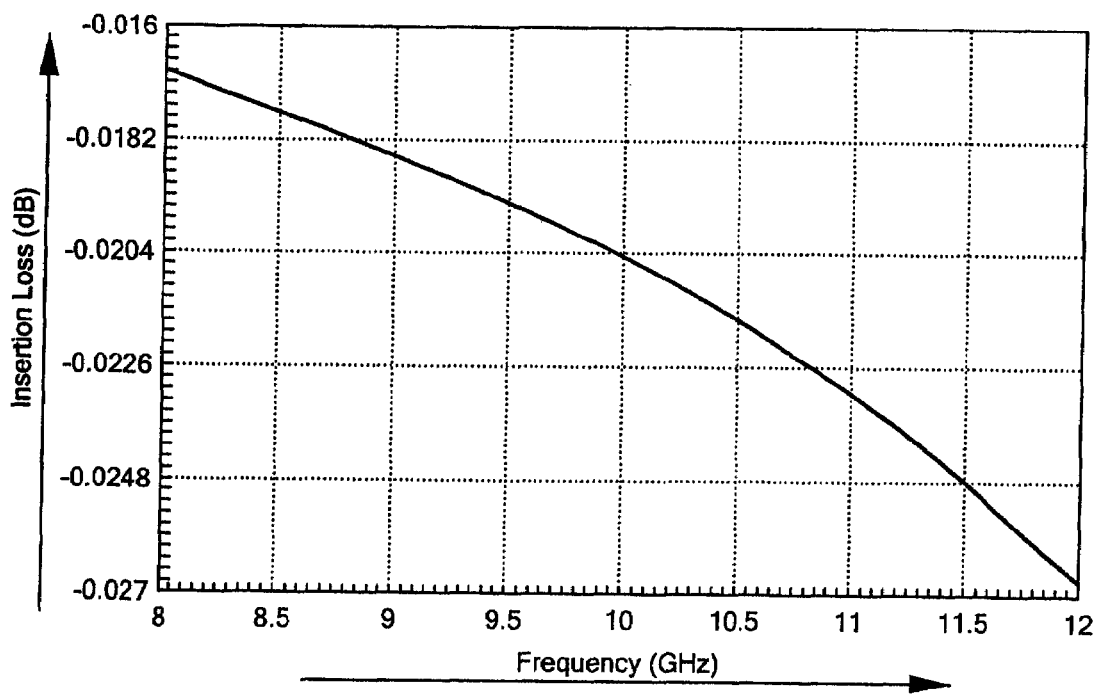
FIG. 4D is a plot of predicted insertion loss vs. frequency for the transition shown in FIGS. 3 and 4.

Referring now to FIG. 4D, a plot of insertion loss vs. frequency for the RF interconnect 294 is shown.

Figure 5:
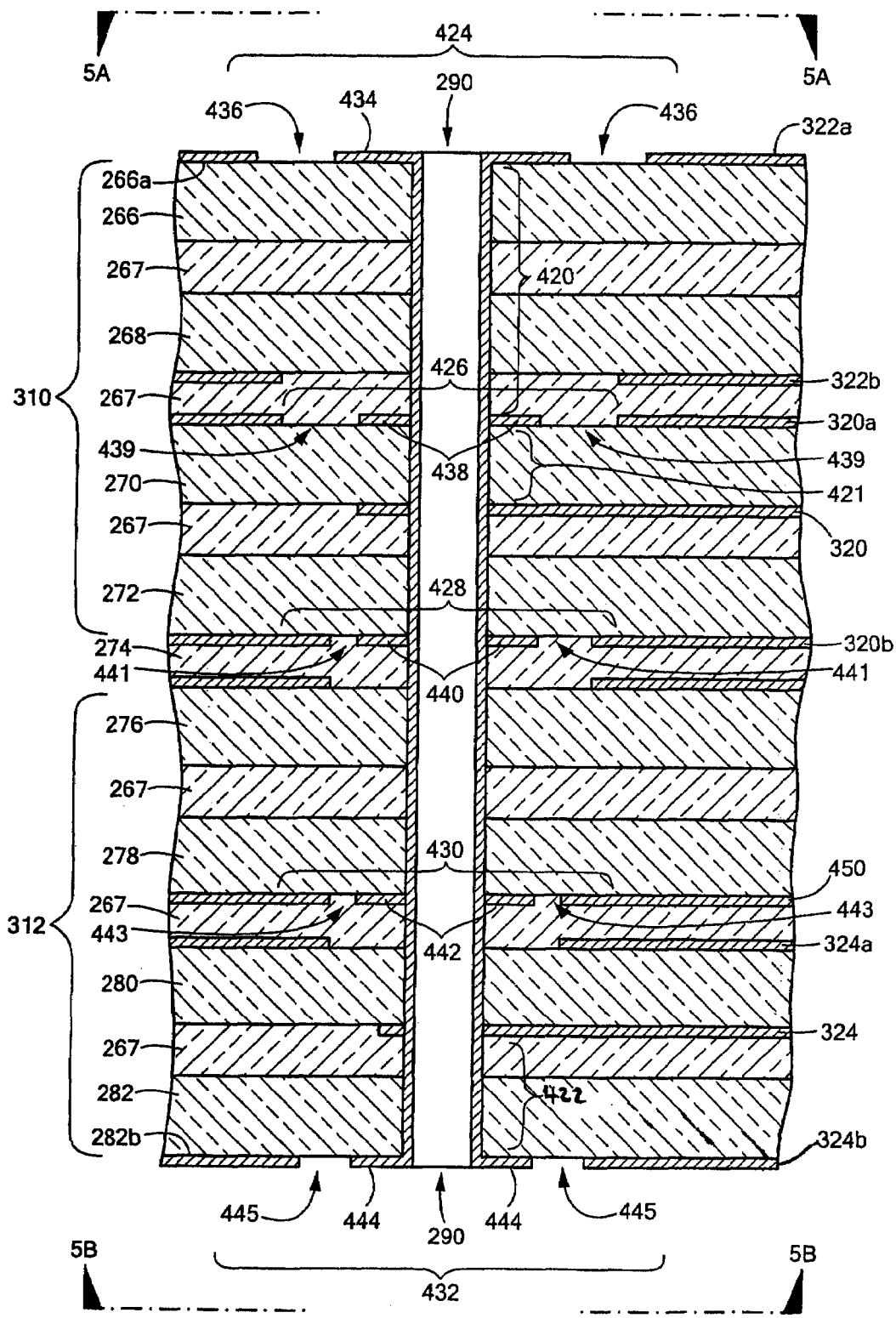
FIG. 5 is an enlarged cross-sectional view of the transition shown in FIG. 3.
Figure 5A:
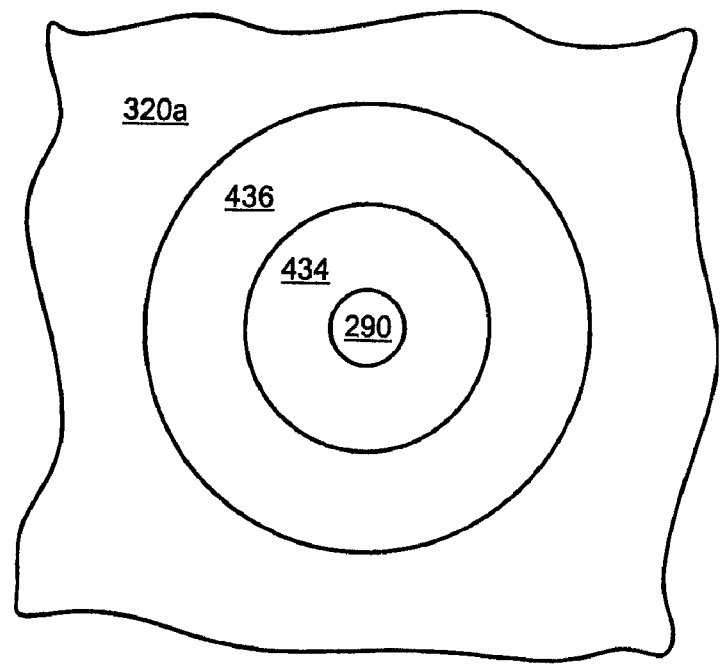
FIG. 5A is a top view of the cross-section in FIG. 5
Figure 5B:
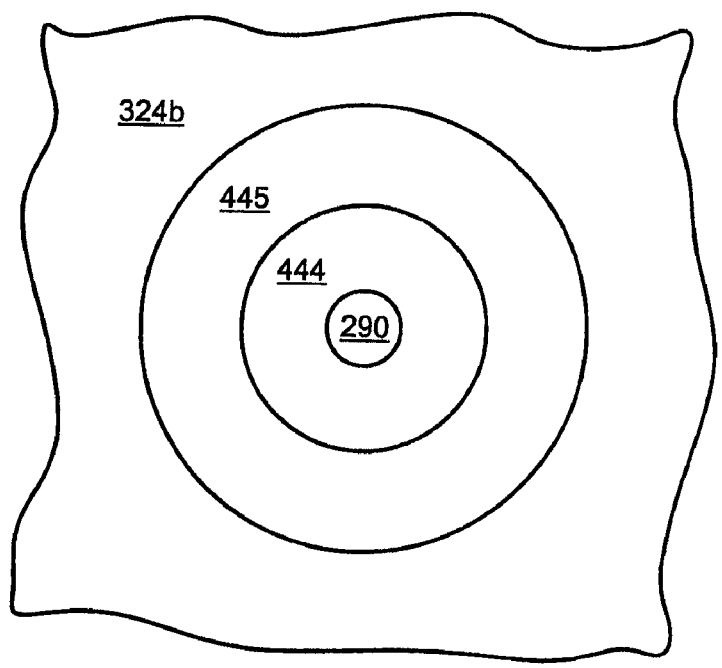
FIG. 5B is a bottom view of the cross-section in FIG. 5
Figure 5C:
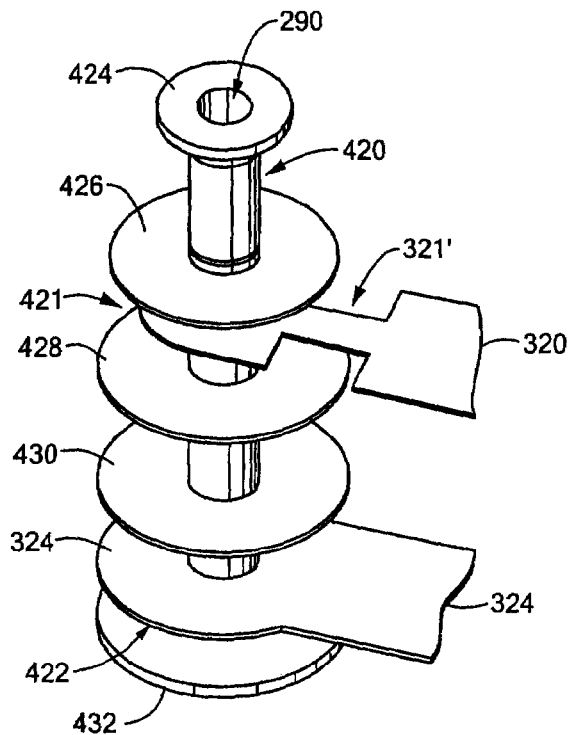
FIG. 5C is an enlarged perspective view of the transition shown in FIG. 3.

Referring now to FIGS. 5-5C in which like elements of FIG. 3 are provided having like reference designations, RF interconnect 290 can be clearly seen to extend from a first end on layer 266a of circuit board 266 to a second end on layer 282b of circuit board 282. As discussed above in conjunction with FIG. 3, RF interconnect 290 couples transmission line 320 on circuit layer 270b to transmission line 324 on circuit layer 280b. It should be noted that transmission line 320 is located in subassembly 310 and transmission line 324 is located in subassembly 312. Thus RF interconnect 290 passes through both subassembly 310 and subassembly 312.

It should be appreciated that in the embodiment shown in FIGS. 3 and 4A, the RF transmission lines 320, 324 each correspond to center conductors of a stripline transmission line with conductors 320a, 320b and 324a, 324b, respectively, corresponding to the ground planes of the stripline configuration.

RF stubs 420, 422 occur as a result of the junctions (or intersections) between the transmission line 320 and the RF interconnect 290. An additional RF stub 422 occurs as a result of the junction (or intersection) between the transmission line 324 and the RF interconnect 290.

To reduce the effect on the RF interconnect 290 due to the stubs 420-422, the RF interconnect 290 is provided having a plurality of RF matching pads 424, 426, 428, 430, 432. The RF matching pad 424 is provided from a first conductive region 434 coupled to the RF interconnect 290. In this exemplary embodiment, the first conductive region of the RF matching pad is provided as a disk-shaped conductor 434. The first conductive region 434 is surrounded by a non-conductive relief area 436 which electrically isolates conductor 434 from the ground plane 322a. In this exemplary embodiment, the relief area 436 is provided as an annular ring defined by a first (or inner) diameter and a second (or outer) diameter.

Similarly, RF matching pads 426, 428, 430, 432 each include respective ones of first conductive region 438, 440, 442, 444 surrounded by respective ones of non-conductive relief areas 439, 441, 443, 445. The relief areas 439, 441, 443, 445 each electrically isolate the conductive regions 438, 440, 442, 444 from the ground planes 320a, 320b, 450, 324b, respectively.

The size and shape of the RF matching pads 424-432 are selected to "tune" (or "match") any impedance and/or transmission characteristics of the respective RF stubs 420, 421, 422. It should be appreciated that RF matching pads need not be the same size or shape as each other. That is, the diameters of the disks 434, 438, 440, 442, 444 need not be the same. Also, the inner and outer diameters of the annular rings 436, 439, 441, 443, 445 need not be the same. Rather, each RF matching pad 424-432 is provided having a shape and dimensions (i.e. a size) which most effectively provides RF interconnect 290 having desired mechanical and electrical performance characteristics.

Also, as illustrated in conjunction with FIGS. 6 and 6A below, the shape of the first conductive region of the RF matching pads 424-432 need not be a disk. Rather the first conductive region of the RF matching pad may be provided having any regular or irregular geometric shape. Likewise, the relief regions need not be provided having an annular shape. Rather the relief regions may be provided having any regular or irregular geometric shape as long as the relief regions substantially electrically isolate the first conductive region of the RF matching pad from the ground planes on the layer on which the first conductive regions occur. For example, as shown in FIG. 5, ground plane 320a is on the same layer as conductive region 438. Thus, relief region 439 (regardless of its size and/or shape and/or the size and/or shape of the conductive region 426) should electrically isolate conductive region 438 from the ground plane conductor 320a.

It should also be appreciated that RF matching pads may be utilized with impedance matching sections of transmission line as illustrated by transmission line section 321' in FIG. 5C. The effect of the impedance characteristics of the matching section 321' should be taken into account when designing (i.e. selecting the shape and dimensions) of the RF matching pads.

Figure 5D:
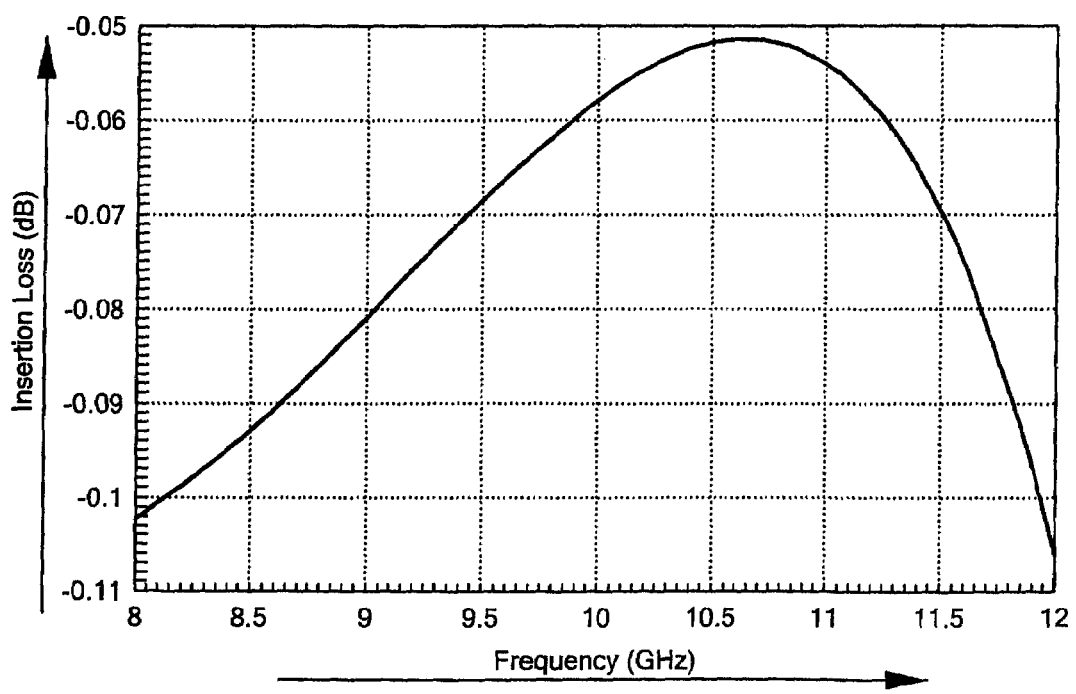
FIG. 5D is a plot of predicted insertion loss vs. frequency for the transition shown in FIGS. 3 and 4.

Referring now to FIG. 5D, a plot of insertion loss vs. frequency for the RF interconnect 290 is shown.

Figure 6:
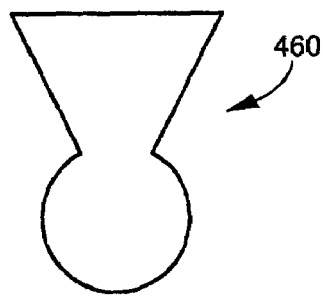
FIG. 6 is a plan view of an exemplary geometry for a conductive region or a relief area of an RF matching pad.
Figure 6A:
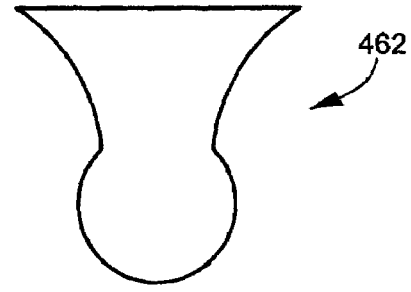
FIG. 6A is a plan view of an exemplary geometry for a conductive region or a relief area of an RF matching pad.

Referring now to FIGS. 6 and 6A, a pair of geometric shapes 460, 462 are illustrative of the shapes in which the first conductive region and/or the relief areas of the RF matching pads may be provided. As mentioned above, the first conductive region of the RF matching pad (e.g. regions 408, 411 in FIGS. 4A, 4B or regions 434, 438, 440, 442, 444 in FIG. 5) may be provided having any regular or irregular geometric shape. Likewise, the relief regions (e.g. regions 409, 412 in FIGS. 4A, 4B or regions 436, 439, 441, 443, 445 in FIG. 5) need not be provided having an annular shape. Rather, the relief regions may be provided having any regular or irregular geometric shape as long as the relief regions substantially electrically isolate the first conductive region of the RF matching pad from the ground planes on the layer on which the first conductive regions occur. Thus, regardless of their size and/or shape, the relief regions should electrically isolate the conductive regions from the ground plane conductor.

The conductive regions and relief regions of the RF matching pads may be provided having any shape including but not limited to rectangular, square, circular, triangular, rhomboid and arc shapes. Also, the conductive regions and relief regions of the RF matching pads may be provided from combinations of any of the above shapes. Also, the conductive regions and relief regions of the RF matching pads may be provided from combinations of any of regular and irregular shape.

Referring now to FIG. 7, a tile subarray 470 includes a T/R module circuit board 472 having disposed thereover an RF circuit board 474. Disposed over the RF circuit board is a DC/Logic circuit board 476. Disposed over the DC/Logic circuit board is a circulator circuit board 478. Each of the T/R module circuit board, RF circuit board, DC/Logic circuit board and a circulator circuit perform substantially the same functions as the T/R module circuits RF circuits, DC/Logic circuits and circulator circuits described above in conjunction with FIGS. 1A-2.

Lastly, disposed over the circulator circuit board is a UMLA 480. The UMLA may be the same as or similar to the UMLAs described above in conjunction with FIGS. 1A-5.

The exemplary embodiment of FIG. 7 illustrates that the T/R modules 472 may be directly attached to a bottom layer of an LMLB. That is, direct MMIC chip-attach approach (MMIC chips not shown) to a bottom layer of the LMLB may be used. This approach may be advantageous in those applications in which relatively high peak transmit power per T/R channel is desired.

All publications and references cited herein are expressly incorporated herein by reference in their entirety.

In the Figures of this application, in some instances, a plurality of elements may be shown as illustrative of a particular element, and a single element may be shown as illustrative of a plurality of a particular elements. Showing a plurality of a particular element is not intended to imply that a system or method implemented in accordance with the invention must comprise more than one of that element or step, nor is it intended by illustrating a single element that the invention is limited to embodiments having only a single one of that respective element. Those skilled in the art will recognize that the numbers of a particular element shown in a drawing can, in at least some instances, be selected to accommodate the particular user needs.

The particular combinations of elements and features in the above-detailed embodiments are exemplary only; the interchanging and substitution of these teachings with other teachings in this and the incorporated-by-reference patents and applications are also expressly contemplated. As those skilled in the art will recognize, variations, modifications, and other implementations of what is described herein can occur to those of ordinary skill in the art without departing from the spirit and the scope of the invention as claimed.

Further, in describing the invention and in illustrating embodiments of the invention in the figures, specific terminology, numbers, dimensions, materials, etc., are used for the sake of clarity. However the invention is not limited to the specific terms, numbers, dimensions, materials, etc. so selected, and each specific term, number, dimension, material, etc., at least includes all technical and functional equivalents that operate in a similar manner to accomplish a similar purpose. Use of a given word, phrase, number, dimension, material, language terminology, product brand, etc. is intended to include all grammatical, literal, scientific, technical, and functional equivalents. The terminology used herein is for the purpose of description and not limitation.

Having described the preferred embodiments of the invention, it will now become apparent to one of ordinary skill in the art that other embodiments incorporating their concepts may be used. Moreover, those of ordinary skill in the art will appreciate that the embodiments of the invention described herein can be modified to accommodate and/or comply with changes and improvements in the applicable technology and standards referred to herein. For example, the technology can be implemented in many other, different, forms, and in many different environments, and the technology disclosed herein can be used in combination with other technologies. Variations, modifications, and other implementations of what is described herein can occur to those of ordinary skill in the art without departing from the spirit and the scope of the invention as claimed. It is felt therefore that these embodiments should not be limited to disclosed embodiments but rather should be limited only by the spirit and scope of the appended claims.

The particular combinations of elements and features in the above-detailed embodiments are exemplary only; the interchanging and substitution of these teachings with other teachings in this and the referenced patents/applications are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto.

What is claimed is:

1. A printed circuit board assembly comprising:
a plurality of circuit boards, each of said plurality of circuit boards having one or more circuit layers; and
a first radio frequency (RF) interconnect having a first portion electrically coupled to at least one circuit layer on a first one of said plurality of circuit boards and having a second portion electrically coupled to at least one circuit layer on a second, different one of said plurality of circuit boards, said first RF interconnect having a first RF stub; and
a first RF matching pad coupled to said first RF interconnect, said first RF matching pad for matching an impedance characteristics of the first RF stub coupled to said first RF interconnect.

2. The printed circuit board assembly of claim 1 wherein the first RF stub is disposed proximate a first end of said first RF interconnect.

3. The printed circuit board assembly of claim 2 wherein said first RF interconnect is provided having a second RF stub disposed proximate a second opposite end of said first RF interconnect.

4. The printed circuit board assembly of claim 3 further comprising a second RF matching pad coupled to said first RF interconnect, said second RF matching pad for matching an impedance characteristics of the second RF stub.

5. The printed circuit board assembly of claim 1 wherein said first RF matching pad comprises:
a conductive disk disposed about said RF interconnect; and
a conductor disposed about and electrically isolated from said conductive disk.

6. The printed circuit board assembly of claim 5 wherein said conductor is disposed about said conductive disk such that a non-conductive annular ring relief area is provided between said conductor and said conductive disk.

7. A printed circuit board assembly comprising:
a plurality of circuit boards, at least two of said plurality of circuit boards having one or more circuit layers disposed thereon; and
a radio frequency (RF) interconnect having a first portion electrically coupled to at least one circuit layer on a first one of said plurality of circuit boards and having a second portion electrically coupled to at least one circuit layer on a second, different one of said plurality of circuit boards, said RF interconnect having a first RF stub; and
a first RF matching pad electrically coupled to said first RF interconnect, said first RF matching pad disposed on a ground plane layer of one of said plurality of printed circuit boards and said RF matching pad comprising a disc shaped conductive portion coupled to said RF interconnect and a non-conductive relief area provided between the disc shaped conductive portion and the ground plane.

8. The printed circuit board assembly of claim 7 wherein said first RF matching pad is a first one of a plurality of RF matching pads coupled to first said RF interconnect.

9. The printed circuit board assembly of claim 8 wherein at least two of said plurality of RF matching pads coupled to said RF interconnect are disposed on different layers of different circuit boards.

10. The printed circuit board assembly of claim 7 wherein said first RF matching pad comprises:
a conductive disk disposed about said RF interconnect; and
a conductor disposed about and electrically isolated from said conductive disk.

11. The printed circuit board assembly of claim 10 wherein said conductor is disposed about said conductive disk such that a non-conductive annular ring relief area is provided between said conductor and said conductive disk.

12. The printed circuit board assembly of claim 7 wherein said first RF interconnect is a first one of a plurality of RF interconnects.

13. The printed circuit board assembly of claim 12, wherein a second, different one of said plurality of RF interconnects has a first RF matching pad electrically coupled thereto.

14. The printed circuit board assembly of claim 13 wherein the second RF interconnect has a second RF matching pad electrically coupled thereto.

15. An radio frequency (RF) circuit board comprising:
a plurality of printed circuit boards coupled to provide a printed circuit board assembly having first and second opposing outermost layers corresponding to RF ground plane layers of the RF circuit board assembly with at least two of said plurality of printed circuit boards having one or more circuit layers disposed thereon; and
a radio frequency (RF) interconnect having a first portion electrically coupled to at least one circuit layer on a first one of the at least two of said plurality of circuit boards and having a second portion electrically coupled to at least one circuit layer on a second, different one of said plurality of circuit boards, said RF interconnect having a first portion thereof corresponding to a first RF stub; and
a first RF matching pad electrically coupled to said first RF interconnect, said first RF matching pad disposed on a ground plane layer of one of said plurality of printed circuit boards and said RF matching pad comprising a disc shaped conductive portion coupled to said RF interconnect and a non-conductive relief area provided between the disc shaped conductive portion and the ground plane.

16. The printed circuit board assembly of claim 15 wherein:
said printed circuit board assembly is provided having first and second opposing outermost layers; and
said RF interconnect extends from the first outermost layer of said printed circuit board assembly to the second outermost layer of said printed circuit board assembly and wherein the first RF stub extends from a first one of said first and second outermost layers through at least one printed circuit board in a direction toward a second one of said first and second outermost layers.

17. The printed circuit board assembly of claim 16 wherein said first and second outermost layers correspond to ground plane layers through at least one printed circuit board in a substantially vertical direction toward a second one of said first and second outermost layers.

18. The printed circuit board assembly of claim 16 wherein said RF interconnect extends in a substantially vertical direction from the first outermost layer of said printed circuit board assembly to the second outermost layer of said printed circuit board assembly and wherein the first RF stub extends from a first one of said first and second outermost layers through at least one printed circuit board in a substantially vertical direction toward a second one of said first and second outermost layers.

19. The printed circuit board assembly of claim 18 wherein said RF interconnect is provided having a second portion thereof corresponding to a second RF stub and wherein said second RF stub extends from a second one of said first and second outermost layers through at least one printed circuit board in a substantially vertical direction toward the first one of said first and second outermost layers.

* * * * *

UNITED STATES PATENT AND TRADEMARK OFFICE
CERTIFICATE OF CORRECTION

PATENT NO. : 7,671,696 B1 Page 1 of 1
APPLICATION NO. : 11/558126
DATED : March 2, 2010
INVENTOR(S) : Angelo M. Puzella et al.

It is certified that error appears in the above-identified patent and that said Letters Patent is hereby corrected as shown below:

Column 25, line 7 delete "characteristics" and replace with --characteristic--.

Column 25, line 19 delete "characteristics" and replace with --characteristic--.

Column 26, line 8 delete "An" and replace with --A--.

Signed and Sealed this

Eleventh Day of May, 2010

David J. Kappos
*Director of the United States Patent and Trademark Office*